United States Patent
Yokoyama et al.

(10) Patent No.: US 9,953,961 B2
(45) Date of Patent: Apr. 24, 2018

(54) SEMICONDUCTOR DEVICE AND METHOD FOR MANUFACTURING THE SAME

(71) Applicant: FUJI ELECTRIC CO., LTD., Kawasaki-shi (JP)

(72) Inventors: Takeshi Yokoyama, Matsumoto (JP); Masaaki Ochiai, Matsumoto (JP); Atsushi Maruyama, Matsumoto (JP); Tomonori Seki, Azumino (JP); Shinichiro Matsunaga, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 288 days.

(21) Appl. No.: 14/512,364

(22) Filed: Oct. 10, 2014

(65) Prior Publication Data

US 2015/0028467 A1 Jan. 29, 2015

Related U.S. Application Data

(63) Continuation of application No. PCT/JP2013/004946, filed on Aug. 21, 2013.

(30) Foreign Application Priority Data

Oct. 1, 2012 (JP) .................................. 2012-219314

(51) Int. Cl.
*H01L 23/495* (2006.01)
*H01L 25/07* (2006.01)
(Continued)

(52) U.S. Cl.
CPC ...... *H01L 25/072* (2013.01); *H01L 23/49513* (2013.01); *H01L 23/49524* (2013.01);
(Continued)

(58) Field of Classification Search
CPC ......... H01L 23/49513; H01L 23/49524; H01L 23/49562; H01L 23/49575; H01L 23/562; H01L 24/32; H01L 24/85; H01L 24/48
(Continued)

(56) References Cited

U.S. PATENT DOCUMENTS 5,038,200 A * 8/1991 Hosomi .............. H01L 23/3107
257/796
5,751,058 A * 5/1998 Matsuki ................ H01L 25/072
257/678
(Continued)

FOREIGN PATENT DOCUMENTS

EP 1115151 A1 7/2001
JP H11-297929 A 10/1999
(Continued)

OTHER PUBLICATIONS

Office Action received in corresponding Chinese Application No. 201380019722.5 dated Jul. 1, 2016.
(Continued)

*Primary Examiner* — Jarrett Stark
*Assistant Examiner* — Charles N Ausar-el
(74) *Attorney, Agent, or Firm* — Rabin & Berdo, P.C.

(57) ABSTRACT

A semiconductor device can reduce the number of bonding wires. The semiconductor device includes two or more semiconductor elements each of which has electrodes on a first main surface and a second main surface, an electrode plate that has one surface which is bonded to electrodes on the first main surfaces of the semiconductor elements, with a first bonding material layer interposed therebetween, and extends over the electrodes on the first main surfaces of the two or more semiconductor elements, and a conductive plate that includes a first lead terminal and a semiconductor element bonding portion which is bonded to electrodes on
(Continued)

the second main surfaces of the semiconductor elements. A second bonding material layer is interposed therebetween, and is connected to the electrodes on the second main surfaces of the two or more semiconductor elements.

19 Claims, 23 Drawing Sheets

(51) Int. Cl.
*H01L 25/00* (2006.01)
*H01L 23/00* (2006.01)
(52) U.S. Cl.
CPC .. *H01L 23/49562* (2013.01); *H01L 23/49575* (2013.01); *H01L 23/562* (2013.01); *H01L 24/32* (2013.01); *H01L 24/48* (2013.01); *H01L 24/85* (2013.01); *H01L 24/97* (2013.01); *H01L 25/50* (2013.01); *H01L 24/45* (2013.01); *H01L 2224/32245* (2013.01); *H01L 2224/45124* (2013.01); *H01L 2224/45144* (2013.01); *H01L 2224/45147* (2013.01); *H01L 2224/48091* (2013.01); *H01L 2224/48247* (2013.01); *H01L 2224/48472* (2013.01); *H01L 2224/49113* (2013.01); *H01L 2224/73265* (2013.01); *H01L 2224/85801* (2013.01); *H01L 2224/92247* (2013.01); *H01L 2224/97* (2013.01); *H01L 2924/00014* (2013.01); *H01L 2924/014* (2013.01); *H01L 2924/01013* (2013.01); *H01L 2924/01028* (2013.01); *H01L 2924/01029* (2013.01); *H01L 2924/01079* (2013.01); *H01L 2924/1033* (2013.01); *H01L 2924/10272* (2013.01); *H01L 2924/1305* (2013.01); *H01L 2924/1306* (2013.01); *H01L 2924/13055* (2013.01); *H01L 2924/13091* (2013.01); *H01L 2924/181* (2013.01)
(58) Field of Classification Search
USPC .......................................................... 257/676
See application file for complete search history.

(56) References Cited

U.S. PATENT DOCUMENTS

| | | | |
|---|---|---|---|
| 6,650,004 B1 | 11/2003 | Horie et al. | |
| 6,703,261 B2 | 3/2004 | Ito | |
| 6,703,707 B1 | 3/2004 | Mamitsu et al. | |
| 7,235,876 B2* | 6/2007 | Okumura | H01L 23/051 257/706 |
| 7,393,711 B2 | 7/2008 | Bolis et al. | |
| 7,612,439 B2* | 11/2009 | Zhang | H01L 23/49562 257/341 |
| 7,888,173 B2* | 2/2011 | Taniguchi | H01L 23/5385 257/E21.502 |
| 8,030,749 B2* | 10/2011 | Soyano | H01L 25/072 257/688 |
| 8,622,276 B2* | 1/2014 | Takahashi | H01L 21/50 228/180.1 |
| 8,624,367 B2* | 1/2014 | Yamada | H01L 23/49589 257/666 |
| 8,995,142 B2* | 3/2015 | Saito | H01L 23/24 174/250 |
| 9,842,795 B2* | 12/2017 | Zommer | H01L 23/49541 |
| 2002/0005578 A1 | 1/2002 | Kodama et al. | |
| 2002/0047187 A1 | 4/2002 | Nakajima et al. | |
| 2003/0162382 A1* | 8/2003 | Aono | H01L 23/49844 438/617 |
| 2004/0032015 A1* | 2/2004 | Sekiguchi | H01L 23/49589 257/684 |
| 2004/0080028 A1* | 4/2004 | Yanagisawa | H01L 23/3107 257/675 |
| 2005/0012206 A1 | 1/2005 | Nakamura et al. | |
| 2008/0224282 A1 | 9/2008 | Ashida et al. | |
| 2009/0209062 A1* | 8/2009 | Egawa | H01L 23/3128 438/108 |
| 2010/0109136 A1* | 5/2010 | Yamada | H01L 23/49589 257/676 |
| 2010/0317241 A1* | 12/2010 | Sugiura | H01R 9/245 439/733.1 |
| 2012/0280363 A1 | 11/2012 | Sumida et al. | |
| 2013/0175678 A1 | 7/2013 | Ide et al. | |
| 2013/0181228 A1* | 7/2013 | Usui | H01L 23/4334 257/77 |
| 2013/0320496 A1 | 12/2013 | Nishijima et al. | |
| 2014/0061673 A1* | 3/2014 | Miyanagi | H01L 24/73 257/77 |

FOREIGN PATENT DOCUMENTS

| | | | |
|---|---|---|---|
| JP | 2000-058693 | A | 2/2000 |
| JP | 2000-068447 | A | 3/2000 |
| JP | 2001-156219 | A | 6/2001 |
| JP | 2001-196518 | A | 7/2001 |
| JP | 2002-151554 | A | 5/2002 |
| JP | 2003-017628 | A | 1/2003 |
| JP | 2003-229449 | * | 8/2003 |
| JP | 2003-229449 | A | 8/2003 |
| JP | 2003-234442 | A | 8/2003 |
| JP | 2004-153234 | A | 5/2004 |
| JP | 2005-528680 | A | 9/2005 |
| JP | 2007-067047 | A | 3/2007 |
| JP | 2008-098586 | A | 4/2008 |
| JP | 2008-108886 | A | 5/2008 |
| JP | 2008-166333 | A | 7/2008 |
| JP | 2008-227131 | A | 9/2008 |
| JP | 2009-064852 | A | 3/2009 |
| JP | 2009-224549 | A | 10/2009 |
| JP | 2010-103231 | A | 5/2010 |
| JP | 2010-153434 | A | 7/2010 |
| JP | 2010-245212 | A | 10/2010 |
| JP | 2011-066390 | A | 3/2011 |
| JP | 2011-066398 | A | 3/2011 |
| JP | 2011-119438 | A | 6/2011 |
| JP | 2012-074648 | A | 4/2012 |
| JP | 2012-114263 | A | 6/2012 |
| WO | WO-1998/012748 | A1 | 3/1998 |
| WO | WO-2012/120568 | A1 | 9/2012 |

OTHER PUBLICATIONS

Office Action received in corresponding Japanese Patent Application dated Jan. 12, 2016.

* cited by examiner

SEMICONDUCTOR DEVICE AND METHOD FOR MANUFACTURING THE SAME

This application is a continuation under 35 U.S.C. 120 of International Application PCT/JP2013/004946 having the International Filing Date of Aug. 21, 2013, and having the benefit of the earlier filing date of Japanese Application No. 2012-219314, filed Oct. 1, 2012. All of the identified applications are fully incorporated herein by reference.

TECHNICAL FIELD

The present invention relates to a semiconductor device including a plurality of semiconductor elements, each of which has electrodes on a first main surface and a second main surface, and a method for manufacturing the same.

BACKGROUND ART

In the related art, as illustrated in FIG. 20, two semiconductor elements 104 are provided in one semiconductor device 130, using a conductive plate 101 including a semiconductor element bonding portion 102, which is a die pad, and a first lead terminal 103 and a lead frame 150 to which second lead terminals 103a and 103b are connected. Electrodes 142 on the second main surfaces of the two semiconductor elements 104 are bonded to the semiconductor element bonding portion 102, with a first bonding material layer 110 interposed therebetween, and the electrodes 141 on the first main surfaces of the semiconductor elements 104 are connected to the second lead terminals 103a and 103b by bonding wires 105.

The semiconductor element bonding portion 102, the first bonding material layer 110, the semiconductor elements 104, and the bonding wires 105 are sealed by a molding resin 113 and are separated from the connected lead frame 150.

In recent years, silicon carbide (SiC) or gallium nitride (GaN) has drawn attention as a semiconductor material which substitutes for silicon (Si). A semiconductor device including a plurality of semiconductor elements is required when used at a large amount of current.

In a semiconductor device including a plurality of semiconductor elements, the plurality of semiconductor elements are arranged in parallel on a substrate. The semiconductor elements are interposed between lead members and are bonded thereto by a solder member. Then, both ends of the lead members are connected to the substrate such that the lead members are not bonded in an inclined state. Then, the components are sealed by a resin (for example, see Patent Document 1, identified further on).

In addition, a plurality of semiconductor elements, each of which has electrodes on the front and rear surfaces, are bonded to a die pad and a plate terminal is bonded to the upper surfaces of the semiconductor elements. The plate terminal is connected to the external terminal by a bonding material. The components are sealed by a resin (for example, see Patent Document 2, identified further on).

A semiconductor element having electrodes on the front and rear surfaces is interposed between a first lead member and a second lead member and is bonded thereto by solder. Then, the components are sealed by a resin (for example, see Patent Document 3 and Patent Document 4, identified further on).

A plurality of semiconductor elements, each of which has electrodes on the front and rear surfaces, are interposed between a first lead member and a second lead member and are bonded thereto by solder. Then, the components are sealed by a resin (for example, see Patent Document 5, identified further on).

For example, a semiconductor element using gallium nitride (GaN) is formed as follows. A GaN layer is grown on a substrate different from a gallium nitride (GaN) substrate and the laminate is used as a base substrate. An insulating film is arranged as a growth mask in a stripe shape on the base substrate. A GaN layer is selectively grown on a portion in which the insulating film is not formed. Then, a GaN layer is grown on the insulating film (for example, see Patent Document 6, Patent Document 7, and Patent Document 8, identified further on). The semiconductor element using gallium nitride (GaN) which is formed by this method is vertically long.

CITATION LIST

Patent Document

Patent Document 1: JP 2010-245212 A
Patent Document 2: JP 2008-227131 A
Patent Document 3: JP 2003-17628 A
Patent Document 4: JP 2008-108886 A
Patent Document 5: JP 2001-196518 A
Patent Document 6: JP 2011-66390 A
Patent Document 7: JP 2011-66398 A
Patent Document 8: JP 2012-114263 A As illustrated in FIG. 20, since one semiconductor device 130 is provided with two semiconductor elements 104, the electrodes 142 on the second main surfaces of the semiconductor elements 104 are bonded to the semiconductor element bonding portion 102, which is a die pad of the lead frame 150, with the first bonding material layer 110 interposed therebetween. The electrodes 141 on the first main surfaces of the semiconductor elements 104 are connected to the second lead terminals 103a and 103b by the bonding wires 105.

In this method, the electrodes 141 on the first main surfaces of the semiconductor elements 104 need to be connected to the second lead terminals 103a and 103b by the bonding wires 105 whose number is equal to at least the number of semiconductor elements 104. In addition, when the amount of current which flows through the semiconductor element 104 is more than the allowable current of the bonding wire 105, the electrodes 141 on the first main surfaces need to be connected to the second lead terminals 103a and 103b by a plurality of bonding wires 105.

Therefore, the number of wire bonding processes which connect the electrodes 141 on the first main surfaces to the second lead terminals 103a and 103b with the bonding wires 105 increases and the problem arises that the processing capability of the process is reduced.

In addition, it is necessary to improve the efficiency of a product for reducing power consumption. However, a resistive component in the material forming the bonding wire 105 hinders the improvement of efficiency.

An object of the invention is to provide a semiconductor device which can reduce the number of bonding wires and a method for manufacturing the same.

SUMMARY

In order to achieve the object, according an aspect of the invention, a semiconductor device includes: semiconductor elements each of which has electrodes on a first main surface and a second main surface; an electrode plate that has one surface which is bonded to the electrodes on the first main surfaces of the semiconductor elements, with a first bonding material layer interposed therebetween, and extends over the electrodes on the first main surfaces of two or more semiconductor elements; and a conductive plate that includes a first lead terminal and a semiconductor element bonding portion which is bonded to the electrodes on the second main surfaces of the semiconductor elements, with a second bonding material layer interposed therebetween, and is connected to the electrodes on the second main surfaces of the two or more semiconductor elements. The other surface of the electrode plate is connected to a second lead terminal by a suitable number of bonding wires with a suitable thickness.

According to another aspect of the invention, a semiconductor device includes: semiconductor elements each of which has electrodes on a first main surface and a second main surface; an electrode plate that includes a lead terminal and a bonding portion which is formed on one surface, is bonded to the electrodes on the first main surfaces of the semiconductor elements, with a first bonding material layer interposed therebetween, and extends over the electrodes on the first main surfaces of two or more semiconductor elements; and a conductive plate that includes a first lead terminal and a semiconductor element bonding portion which is bonded to the electrodes on the second main surfaces of the semiconductor elements, with a second bonding material layer interposed therebetween, and is connected to the electrodes on the second main surfaces of the two or more semiconductor elements. The use of the electrode plate including the lead terminal and the bonding portion makes it possible to reduce the number of wire bonding processes.

According to the invention, when two or more semiconductor elements are provided in one semiconductor device, it is possible to reduce the number of bonding wires.

DETAILED DESCRIPTION

Hereinafter, embodiments of the invention will be described with reference to the drawings.

In the following embodiments, a diode is mainly used as a semiconductor element 4. However, the semiconductor element 4 is not limited to the diode, but may be, for example, a metal-oxide-semiconductor field effect transistor (MOSFET) or an insulated gate bipolar transistor (IGBT).

In the following description, a semiconductor device 30 is a transistor outline (TO) package sealed with a resin seal, such as TO220, but is not limited thereto.

Figure 20:
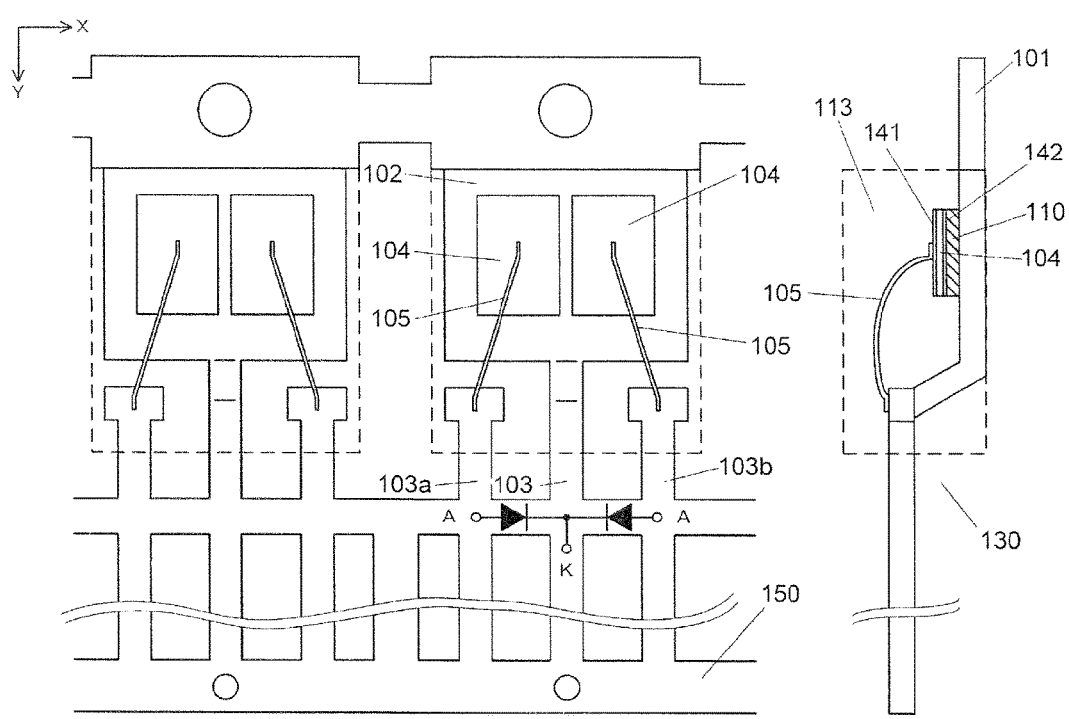
FIG. 20 is a plan view and a side view illustrating the related art.
Figure 21:
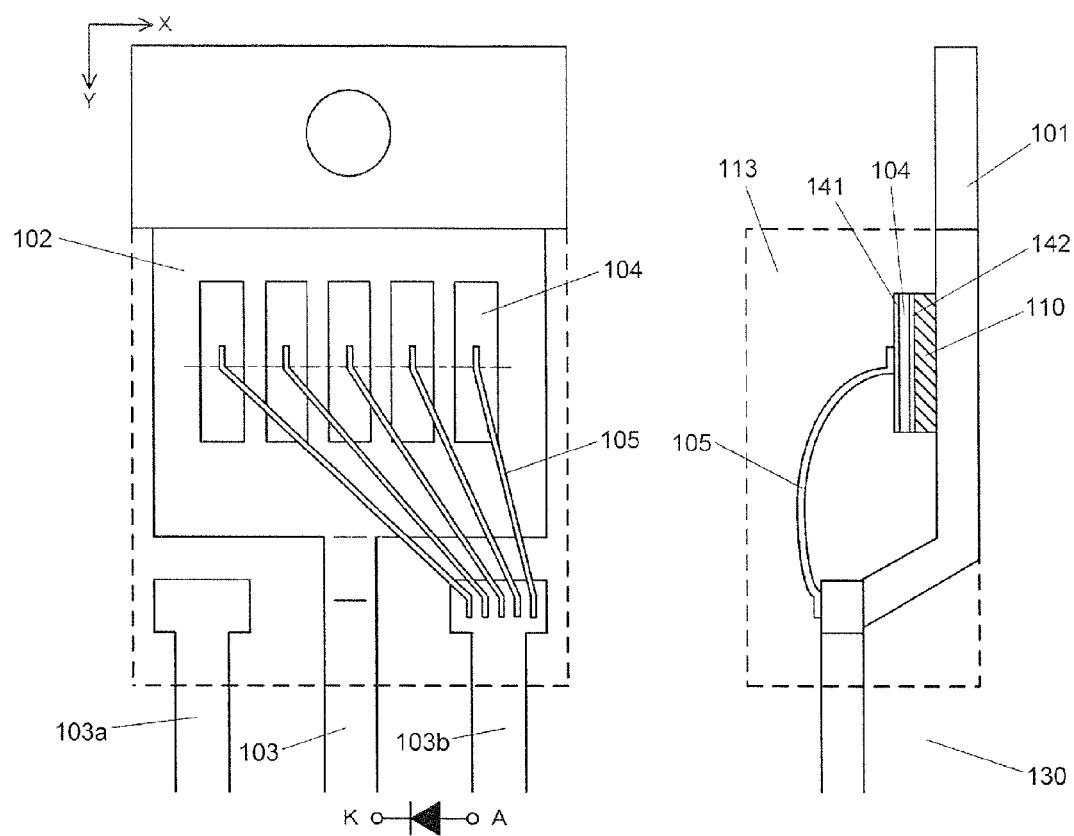
FIG. 21 is a plan view and a side view illustrating a reference example.

As in the related art illustrated in FIG. 20, when the electrodes 141 on the first main surfaces of the semiconductor elements 104 are connected to the second lead terminals 103a and 103b by the bonding wires 105, the electrodes 141 on the first main surfaces need to be connected to the second lead terminal 103b by the bonding wires 105 whose number is equal to or greater than the number of semiconductor elements 104 mounted, as illustrated in FIG. 21.

A vertically long semiconductor element is a wide-bandgap semiconductor element made of, for example, silicon carbide (SiC) or gallium nitride (GaN). However, the vertically long semiconductor element may be a silicon semiconductor element. The length of the vertically long semiconductor element in the longitudinal direction is, for example, equal to or greater than about 1000 µm and equal to or less than about 3000 µm, the length thereof in the lateral direction is, for example, equal to or greater than about 100 µm and equal to or less than about 300 µm, and the ratio of the length in the longitudinal direction to the length in the lateral direction is, for example, equal to or greater than about 10:1.

In the drawings, the number of semiconductor elements 4 is not limited to that illustrated in each drawing and the number of bonding wires 5 is not limited to that illustrated in each drawing.

Embodiment 1

Figure 1:
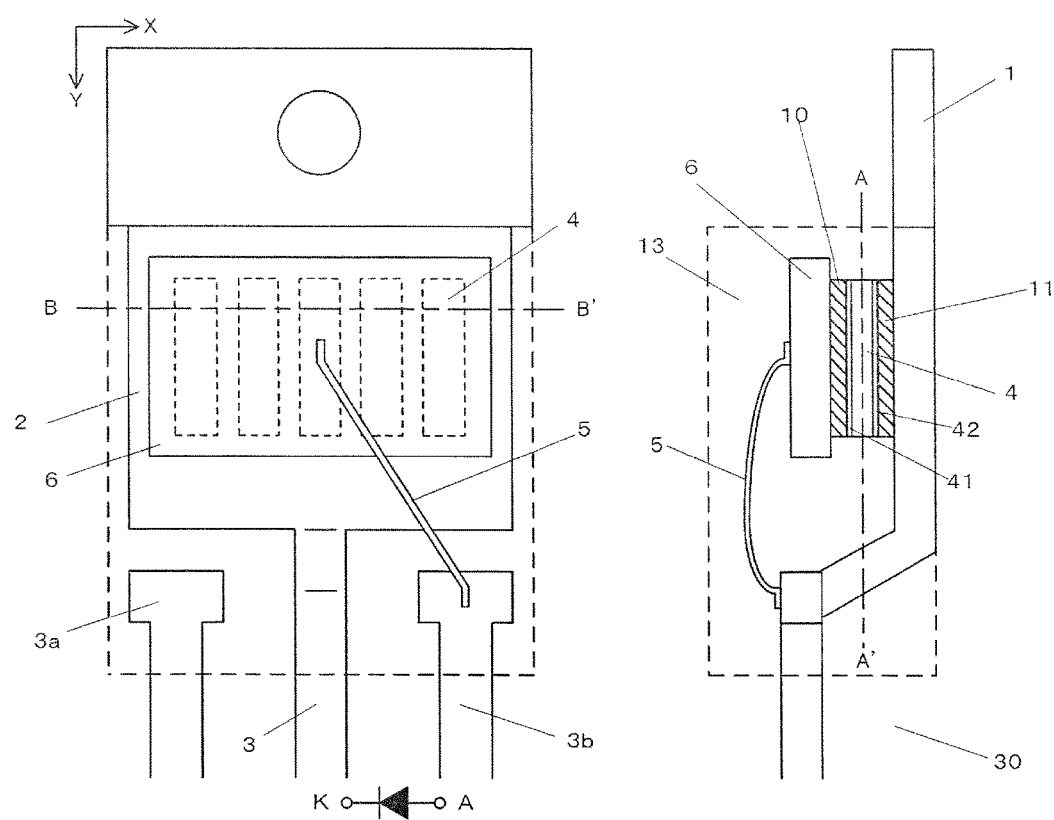
FIG. 1 is a plan view and a side view illustrating Embodiment 1 of the invention.
Figure 2:
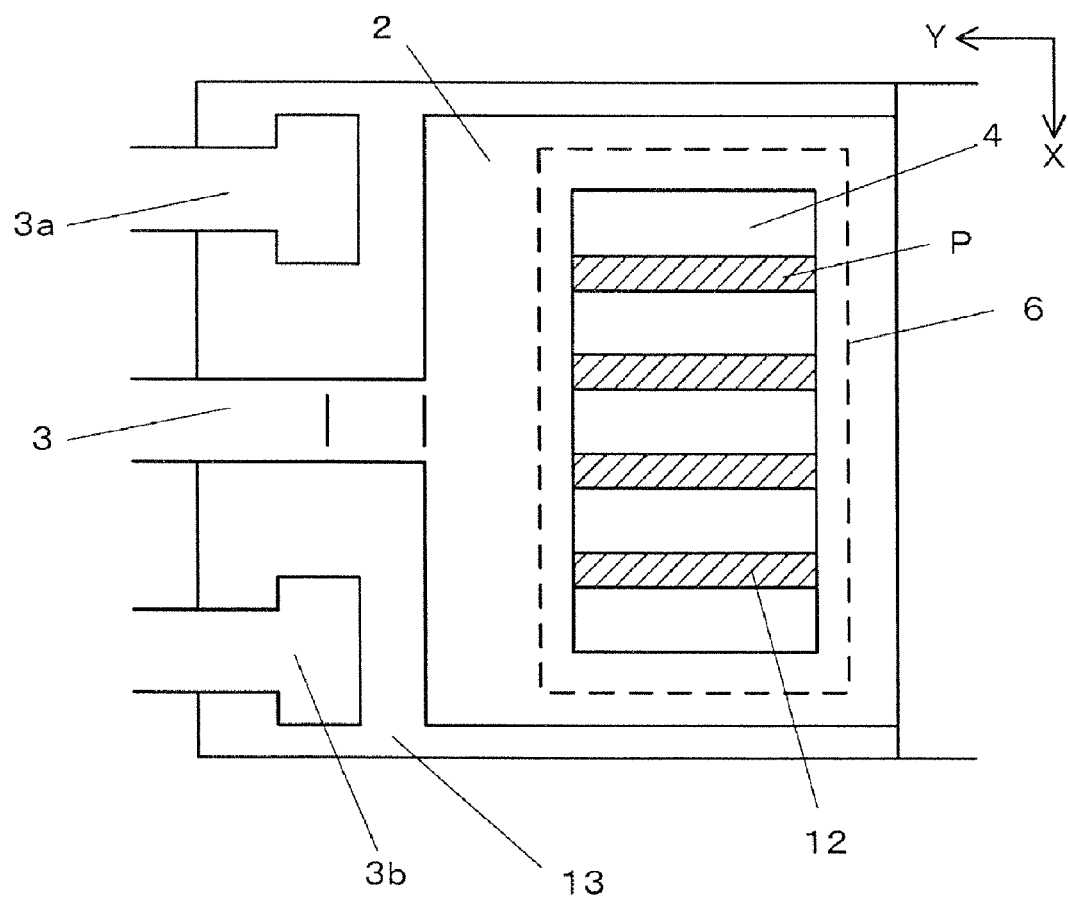
FIG. 2 is a cross-sectional view taken along the line A-A' of FIG. 1.

FIGS. 1, 2, and 3A-3B are diagrams illustrating a structure according to Embodiment 1 of the invention. FIG. 1 is a plan view and a side view illustrating Embodiment 1 of the invention, FIG. 2 is a cross-sectional view taken along the line A-A' of FIG. 1, and FIGS. 3A-3C are cross-sectional views taken along the line B-B' of FIG. 1.

A semiconductor device 30 is a TO package sealed with a resin, such as TO220. A first lead terminal 3 and second lead terminals 3a and 3b are arranged in parallel to the Y direction of a coordinate system illustrated in the drawings.

The Y direction of the coordinate system illustrated in the drawings is the same as the injection direction of a molding resin 13 during resin sealing. In addition, as illustrated in the drawings, portions of the first lead terminal 3 and the second lead terminals 3a and 3b are exposed without being covered with the molding resin 13 and the first lead terminal 3 and the second lead terminals 3a and 3b serve as external terminals.

Two or more semiconductor elements 4 provided in the semiconductor device 30 are vertically long and are arranged in parallel to the X direction of the coordinate system illustrated in the drawings. The semiconductor element 4 is arranged such that the longitudinal direction thereof is parallel to the Y direction of the coordinate system illustrated in the drawings.

Electrodes 42 on the second main surfaces of the two or more semiconductor elements 4 are bonded to a semiconductor element bonding portion 2 of a conductive plate 1, with a second bonding material layer 11 interposed therebetween. In addition, one surface of an electrode plate 6 is bonded to electrodes 41 on the first main surfaces of the two or more semiconductor elements 4, with a first bonding material layer 10 interposed therebetween.

The other surface of the electrode plate 6 and the second lead terminals 3b are connected to each other by bonding wires 5 and are sealed by the molding resin 13. A surface of the conductive plate 1 to which the semiconductor element 4 is not bonded is exposed without being sealed by the molding resin 13.

The first bonding material layer 10 and the second bonding material layer 11 are preferably solder paste with high thermal conductivity or silver-based conductive paste.

Since the one surface of the electrode plate 6 is bonded to the electrodes 41 on the first main surfaces of a plurality of semiconductor elements 4, a wire bonding region that is larger than the electrode 41 on the first main surface of each semiconductor element 4 can be ensured on the other surface of the electrode plate 6.

Therefore, it is easy to use the bonding wire 5 with a large diameter or the bonding wire 5 having a ribbon shape and it is possible to reduce the number of bonding wires 5, as compared to the related art.

In addition, it is not necessary to connect the second lead terminal 3b to the electrode 41 on the first main surface of one semiconductor element 4 with one or more bonding wires 5, unlike the related art. Therefore, it is possible to reduce the number of bonding wires 5.

The bonding wire 5 may connect the electrode plate 6 and the second lead terminal 3a.

It is preferable that the bonding wire 5 be made of Al, Cu, or Au with a large allowable current.

It is preferable that the electrode plate 6 be made of Cu or Al with high thermal conductivity or alloys including Cu or Al. A plating process using Ni or a plating process using Sn-based solder may be performed on the surface of the electrode plate 6.

It is preferable that the conductive plate 1 including the semiconductor element bonding portion 2 and the first lead terminal 3 and the second lead terminals 3a and 3b be made of Cu, Al, or alloys including Cu or Al. A plating process using Ni or a plating process using Sn-based solder may be performed on the surfaces thereof.

A space P which is surrounded by the semiconductor elements 4, the semiconductor element bonding portion 2 of the conductive plate 1, and the one surface of the electrode plate 6 is filled with a resin 12 before the other surface of the electrode plate 6 is connected to the second lead terminal 3b by the bonding wire 5. The resin 12 reduces mechanical impact during wire bonding.

In addition, similarly to the molding resin 13, the resin 12 includes a filler. The resin 12 which includes a filler with a smaller diameter than the filler included in the molding resin 13 and can be filled in the space P surrounded by the semiconductor elements 4, the semiconductor element bonding portion 2 of the conductive plate 1, and the one surface of the electrode plate 6 is selected. When the diameter of the filler included in the molding resin 13 is greater than the space P, it is difficult to fill the space P with the molding resin 13 during resin sealing. Therefore, the space P which is not filled with the molding resin 13 during resin sealing is filled with the resin 12. As a result, it is possible to reduce the possibility of a crack occurring due to a reliability test, such as a heat cycle test or a heat shock test, for a portion which is not filled with the molding resin 13.

Figure 3A:
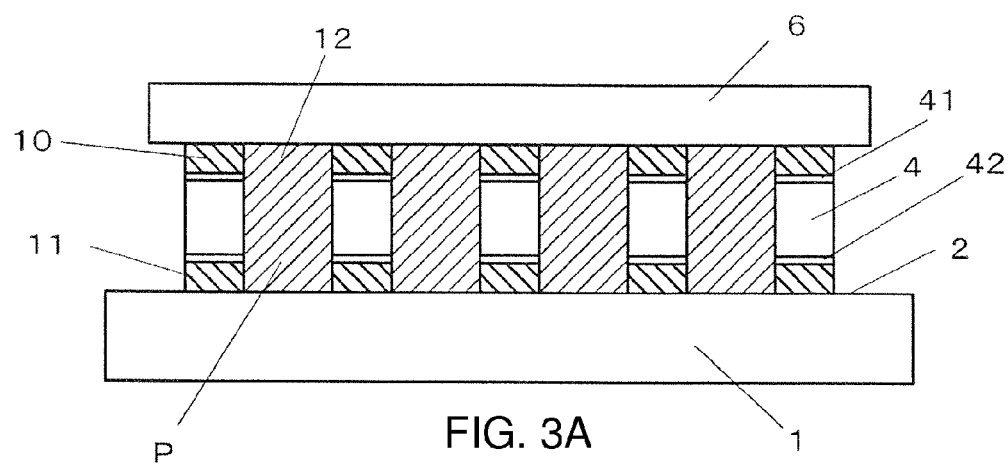
FIGS. 3A, 3B and 3C are cross-sectional views taken along the line B-B' of FIG. 1.
Figure 3B:
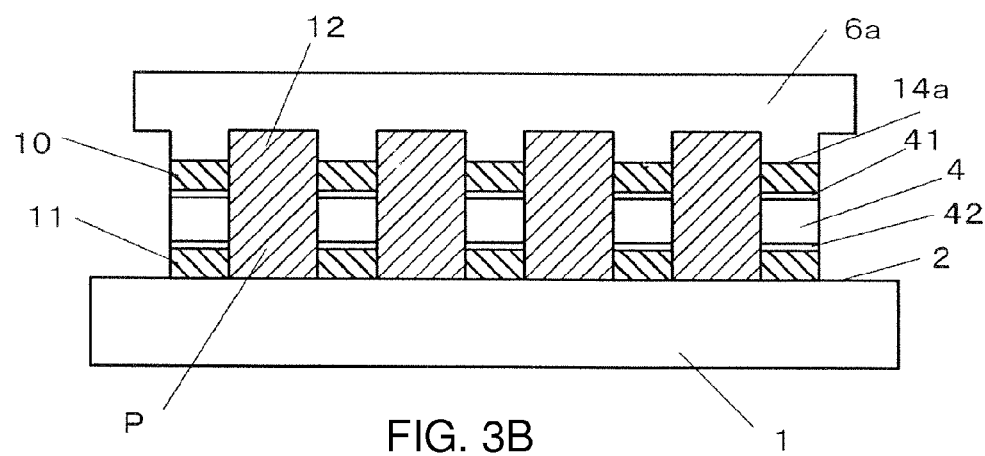

It is preferable that the resin 12 be a thermosetting resin having the same linear expansion coefficient as the molding resin 13 in order to suppress the occurrence of a crack. Therefore, in the embodiment of the invention, the resin 12 is an epoxy-based resin, similarly to the molding resin 13. In addition, the one surface of the electrode plate 6 which is bonded to the electrode 41 on the first main surface of the semiconductor element 4 may be flat as illustrated in FIG. 3A, or convex portions 14a and 14b may be formed on the one surface of the electrode plate 6, as illustrated in FIGS. 3B and 3C.

When the convex portion 14a or 14b is formed on the one surface of the electrode plate 6, a space between the semiconductor element bonding portion 2 of the conductive plate 1 and the one surface of the electrode plate 6 is less than the diameter of the filler included in the resin 12. Therefore, it is possible to improve the fluidity of the resin 12.

In addition, the space P may not be filled with the resin 12 in the following case: the diameter of the bonding wire 5 is small and mechanical impact during wire bonding is small; and the space P is more than the diameter of the filler included in the molding resin 13 and does not hinder the flow of the molding resin 13.

Figure 3C:
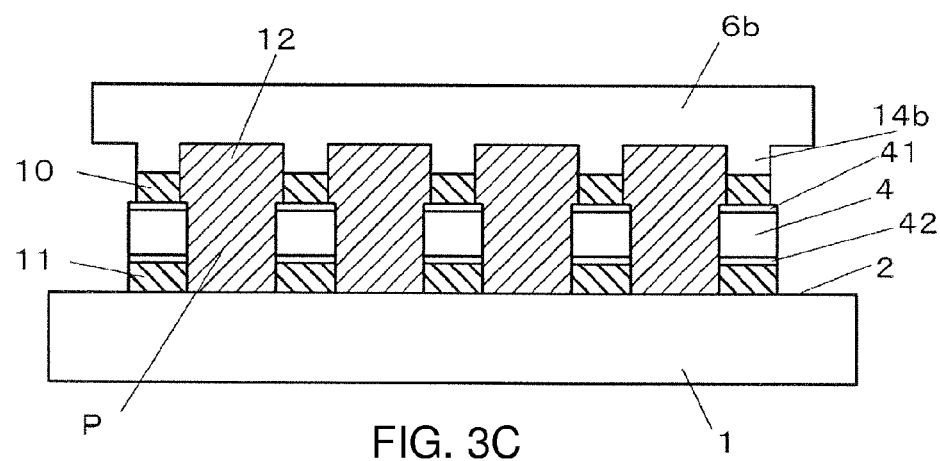

As illustrated in FIG. 3C, the convex portion 14b is smaller than the electrode 41 on the first main surface of the semiconductor element 4, which makes it possible to prevent the first bonding material layer 10 from being attached to the side surface of the semiconductor element 4.

Embodiment 1 of the invention can use the same lead frame as the lead frame 150 (see FIG. 20) according to the related art in which the conductive plate 101 including the semiconductor element bonding portion 102 and the first lead terminal 103 is connected to the second lead terminals 103a and 103b. Therefore, it is not necessary to design a new conductive plate 1 and thus to reduce manufacturing costs.

Embodiment 2

Figure 4:
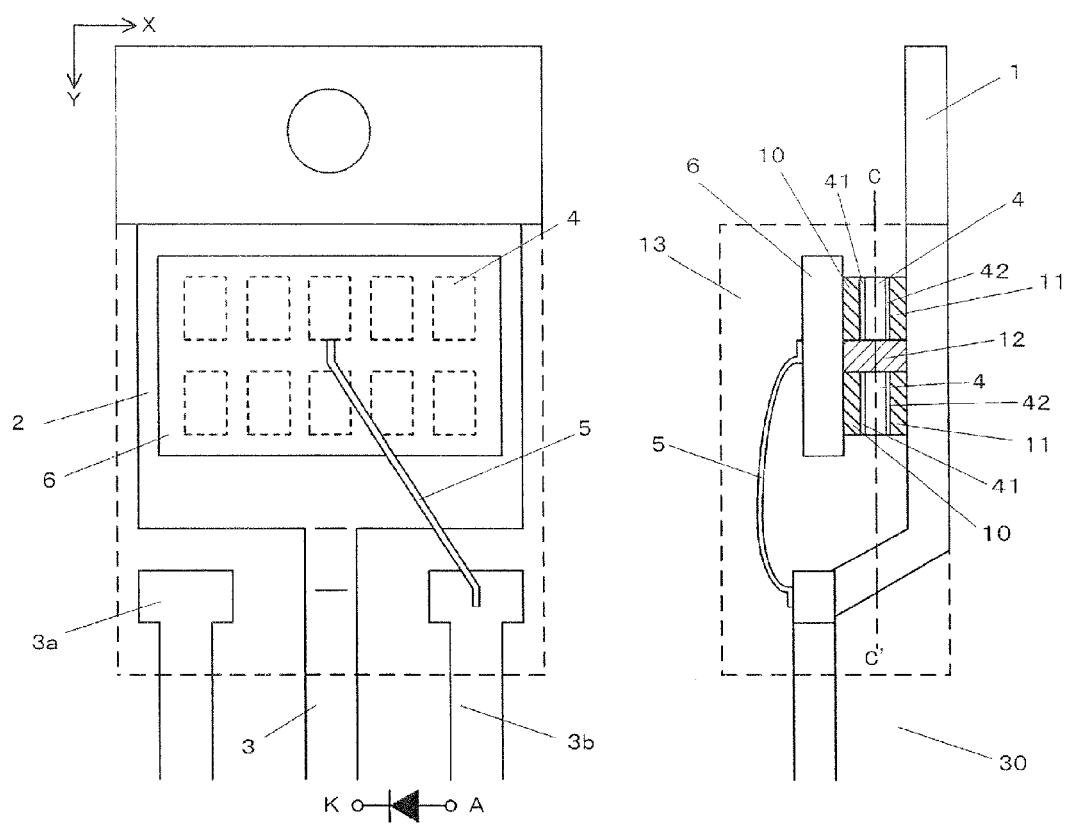
FIG. 4 is a plan view and a side view illustrating Embodiment 2 of the invention.
Figure 5:
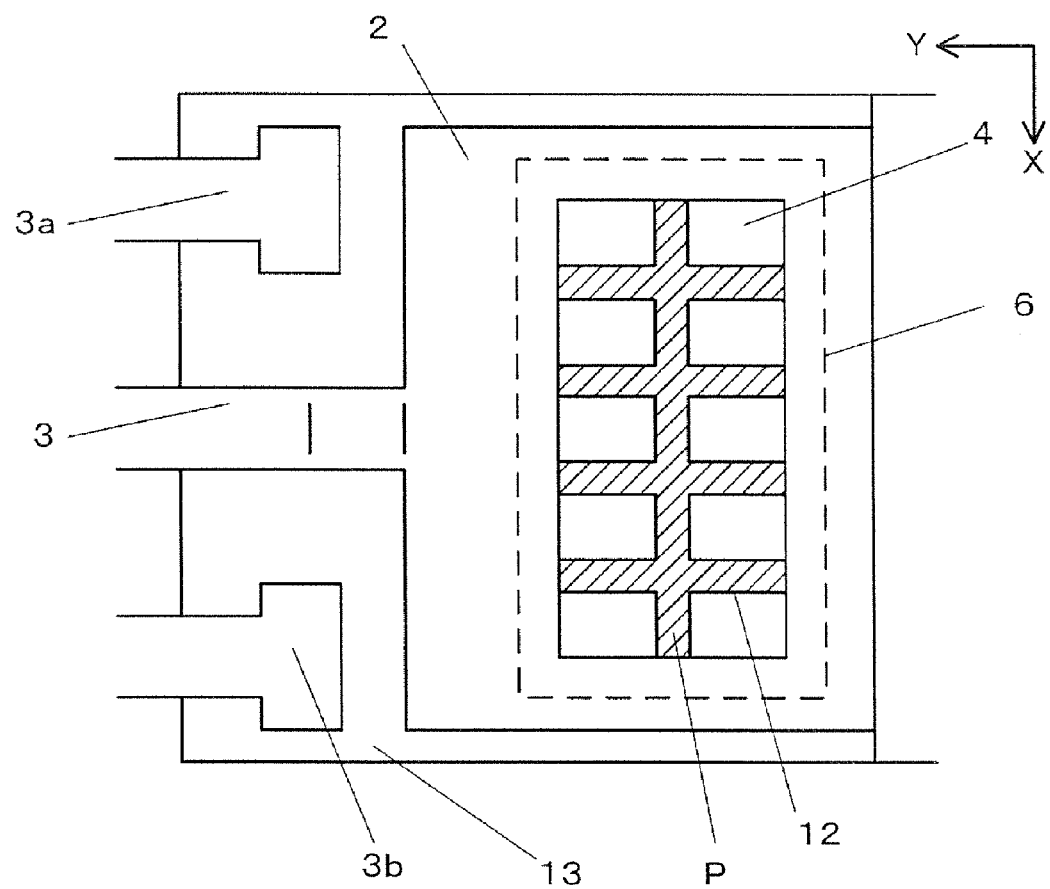
FIG. 5 is a cross-sectional view taken along the line C-C' of FIG. 4.

FIGS. 4 and 5 are diagrams illustrating a structure according to Embodiment 2 of the invention and illustrate a modification of Embodiment 1. FIG. 4 is a plan view and a side view illustrating Embodiment 2 of the invention. FIG. 5 is a cross-sectional view taken along the line C-C' of FIG. 4.

Semiconductor elements 4 are arranged in two rows in the Y direction of a coordinate system illustrated in the drawings and are arranged in parallel to the X direction of the coordinate system illustrated in the drawings.

A space P which is surrounded by the semiconductor elements 4, a semiconductor element bonding portion 2 of a conductive plate 1, and one surface of an electrode plate 6 is filled with a resin 12 before the other surface of the electrode plate 6 is connected to second lead terminals 3b by bonding wires 5.

The resin 12 can reduce mechanical impact during wire bonding.

In addition, similarly to a molding resin 13, the resin 12 includes a filler. The resin 12 which includes a filler with a smaller diameter than the filler included in the molding resin 13 can be filled in the space P surrounded by the semiconductor elements 4, the semiconductor element bonding portion 2 of the conductive plate 1, and the one surface of the electrode plate 6 is selected. When the diameter of the filler included in the molding resin 13 is greater than the space P, it is difficult to fill the space P with the molding resin 13 during resin sealing. Therefore, the space P in which the fluidity of the molding resin 13 is low during resin sealing is filled with the resin 12. As a result, it is possible to reduce the possibility of a crack occurring due to a reliability test, such as a heat cycle test or a heat shock test, for a portion which is not filled with the molding resin 13.

It is preferable that the resin 12 be a thermosetting resin having the same linear expansion coefficient as the molding resin 13 in order to suppress the occurrence of a crack. Therefore, in the embodiment of the invention, the resin 12 is an epoxy-based resin, similarly to the molding resin 13. In addition, the one surface of the electrode plate 6 which is bonded to the electrode 41 on the first main surface of the semiconductor element 4 may be flat as illustrated in FIG. 3A, or convex portions 14a and 14b may be formed on the one surface of the electrode plate 6, as illustrated in FIGS. 3B and 3C.

Embodiment 3

Figure 6:
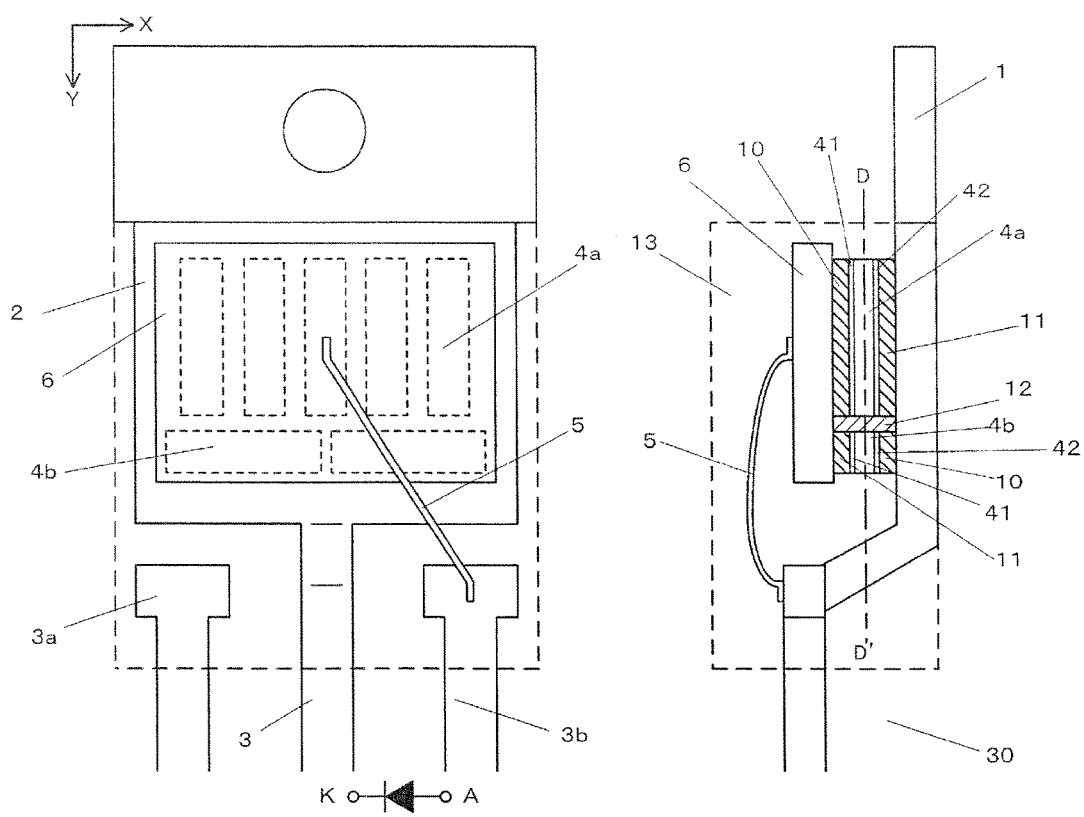
FIG. 6 is a plan view and a side view illustrating Embodiment 3 of the invention.
Figure 7:
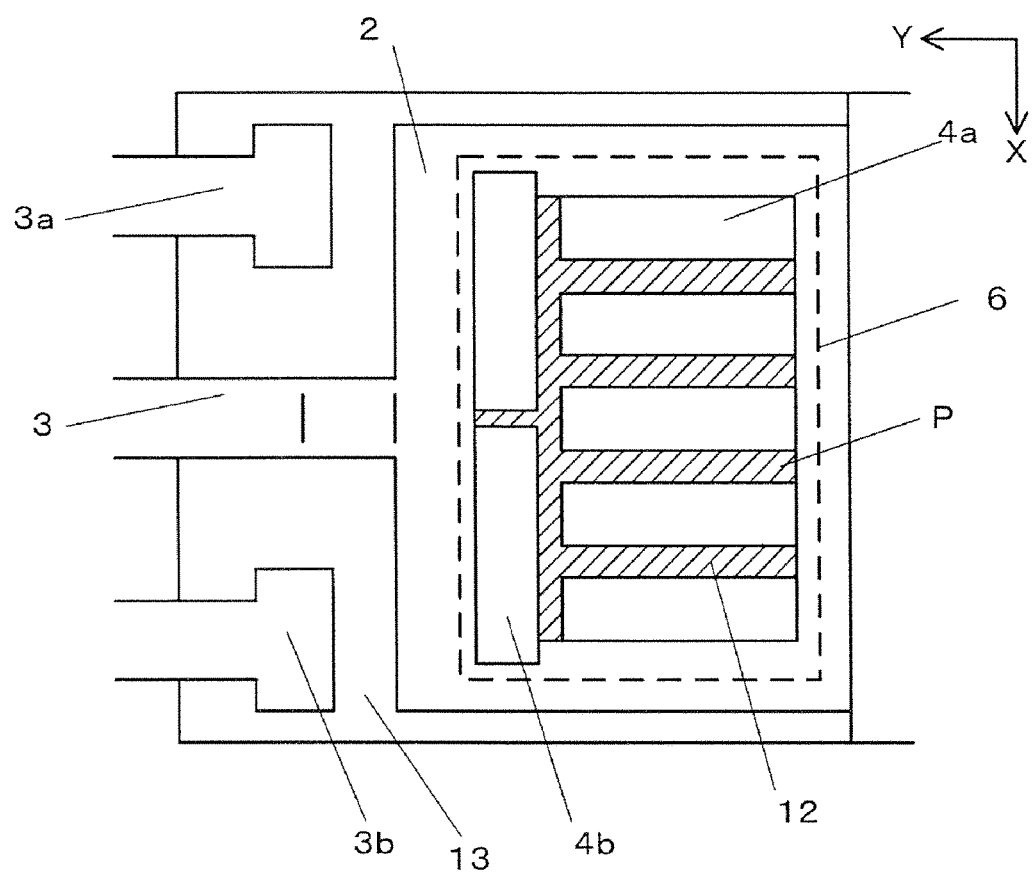
FIG. 7 is a cross-sectional view taken along the line D-D' of FIG. 6.

FIGS. 6 and 7 are diagrams illustrating a structure according to Embodiment 3 of the invention and illustrate a modification of Embodiment 1. FIG. 6 is a plan view and a side view illustrating Embodiment 3 of the invention. FIG. 7 is a cross-sectional view taken along the line D-D' of FIG. 6.

Semiconductor elements 4a and 4b have the same shape, that is, a vertically long shape and are arranged in parallel to the X direction of a coordinate system illustrated in the drawings. The semiconductor elements 4a are arranged such that the longitudinal direction thereof is parallel to the Y direction of the coordinate system illustrated in the drawings. The semiconductor elements 4b are arranged such that the longitudinal direction thereof is parallel to the X direction of the coordinate system illustrated in the drawings.

A space P which is surrounded by the semiconductor elements 4a and 4b, a semiconductor element bonding portion 2 of a conductive plate 1, and one surface of an electrode plate 6 is filled with a resin 12 before the other surface of the electrode plate 6 is connected to second lead terminals 3b by bonding wires 5.

In this case, the semiconductor element 4b can prevent the resin 12 which is injected in the Y direction of the coordinate system illustrated in the drawings from flowing from the semiconductor element bonding portion 2 of the conductive plate 1.

The resin 12 reduces mechanical impact during wire bonding.

In addition, similarly to a molding resin 13, the resin 12 includes a filler. The resin 12 which includes a filler with a smaller diameter than the filler included in the molding resin 13 and can be filled in the space P surrounded by the semiconductor elements 4a, the semiconductor element bonding portion 2 of the conductive plate 1, and the one surface of the electrode plate 6 is selected. When the diameter of the filler included in the molding resin 13 is greater than the space P, it is difficult to fill the space P with the molding resin 13 during resin sealing. Therefore, the space P which is not filled with the molding resin 13 during resin sealing is filled with the resin 12. As a result, it is possible to reduce the possibility of a crack occurring due to a reliability test, such as a heat cycle test or a heat shock test, for a portion which is not filled with the molding resin 13.

It is preferable that the resin 12 be a thermosetting resin having the same linear expansion coefficient as the molding resin 13 in order to suppress the occurrence of a crack. Therefore, in the embodiment of the invention, the resin 12 is an epoxy-based resin, similarly to the molding resin 13. In addition, the one surface of the electrode plate 6 which is bonded to the electrodes 41 on the first main surfaces of the semiconductor elements 4a and 4b may be flat as illustrated in FIG. 3A, or convex portions 14a and 14b may be formed on the one surface of the electrode plate 6, as illustrated in FIGS. 3B and 3C.

Embodiment 4

Figure 8:
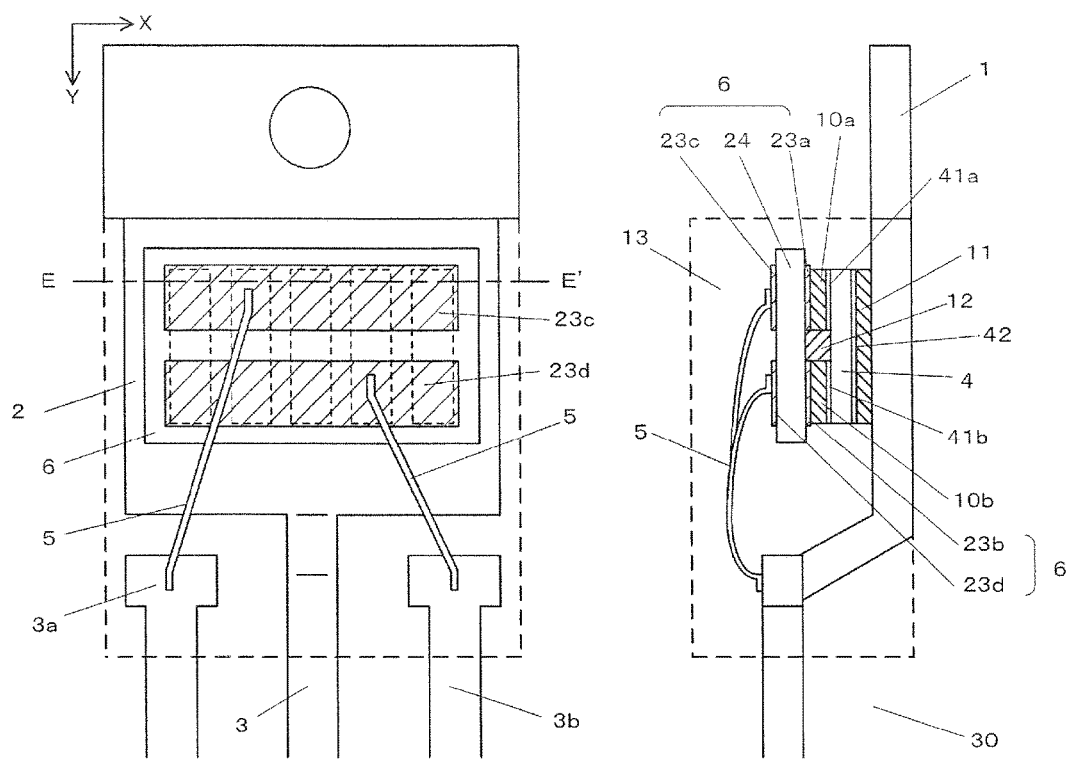
FIG. 8 is a plan view and a side view illustrating Embodiment 4 of the invention.
Figure 9:
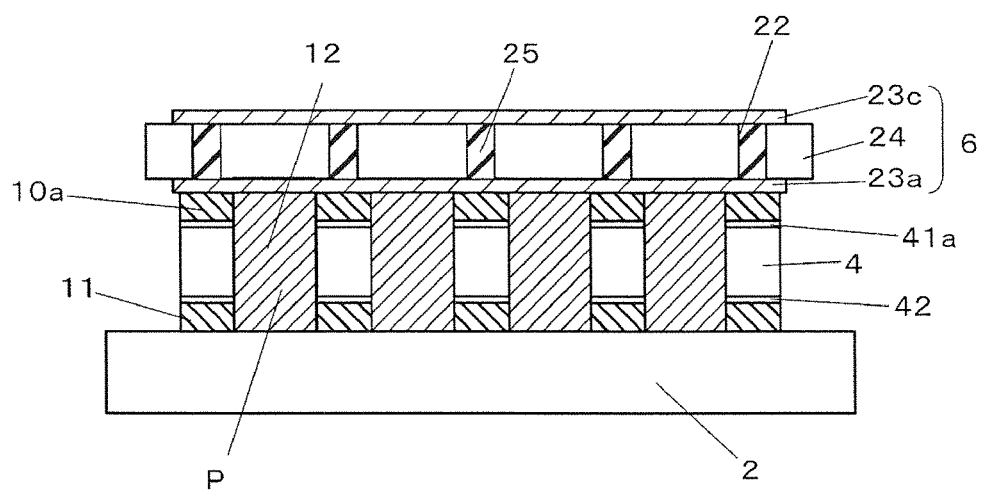
FIG. 9 is a cross-sectional view taken along the line E-E' of FIG. 8.

FIGS. 8 and 9 are diagrams illustrating a structure according to Embodiment 4 of the invention. FIG. 8 is a plan view and a side view illustrating Embodiment 4 of the invention and FIG. 9 is a cross-sectional view taken along the line E-E' of FIG. 8.

Two electrodes 41a and 41b are formed on a first main surface of a semiconductor element 4. For example, the two electrodes are a gate G and a source S in a MOSFET and are a gate G and an emitter E in an IGBT.

A semiconductor device 30 is a TO package sealed with a resin, such as TO220. A first lead terminal 3 and second lead terminals 3a and 3b are arranged in parallel to the Y direction of a coordinate system illustrated in the drawings. The Y direction of the coordinate system illustrated in the drawings is the same as the injection direction of a molding resin 13 during resin sealing. As illustrated in the drawings, portions of the first lead terminal 3 and the second lead terminals 3a and 3b are exposed without being covered with the molding resin 13 and the first lead terminal 3 and the second lead terminals 3a and 3b serve as external terminals.

Two or more semiconductor elements 4 provided in the semiconductor device are vertically long and are arranged in parallel to the X direction of the coordinate system illustrated in the drawings. The semiconductor elements 4 are arranged such that the longitudinal direction thereof is parallel to the Y direction of the coordinate system illustrated in the drawings.

Electrodes 42 on the second main surfaces of the two or more semiconductor elements 4 are bonded to a semiconductor element bonding portion 2 of a conductive plate 1, with a second bonding material layer 11 interposed therebetween. In addition, one surface of an electrode plate 6 is bonded to the electrodes 41a and 41b on the first main surfaces of the semiconductor elements 4, with first bonding material layers 10a and 10b interposed therebetween. In this case, the one surface of the electrode plate 6 is bonded to the electrodes 41a and 41b on the first main surfaces of the two or more semiconductor elements so as to extend over the electrodes 41a and 41b.

A space which is surrounded by the semiconductor elements 4, the semiconductor element bonding portion 2 of the conductive plate 1, and the one surface of the electrode plate 6 is filled with a resin 12.

The resin 12 can reduce mechanical impact during wire bonding. The space which is not filled with the molding resin 13 during resin sealing is filled with the resin 12. Therefore, it is possible to reduce the possibility of a crack occurring due to a reliability test, such as a heat cycle test or a heat shock test, for a portion which is not filled with the molding resin 13.

It is preferable that the resin 12 be a thermosetting resin having the same linear expansion coefficient as the molding resin 13 in order to suppress the occurrence of a crack. Therefore, in the embodiment of the invention, the resin 12 is an epoxy-based resin, similarly to the molding resin 13. The resin 12 which includes a filler with a smaller diameter than the filler included in the molding resin 13 and can be filled in the space surrounded by the semiconductor elements 4, the semiconductor element bonding portion 2 of the conductive plate 1, and the one surface of the electrode plate 6 is selected.

In addition, wiring lines 23c and 23d on the other surface of the electrode plate 6 and the second lead terminals 3a and 3b are connected to each other by bonding wires 5, respectively, and are sealed by the molding resin 13.

The electrode plate 6 includes an insulating substrate 24. Wiring lines 23a and 23b are formed on one surface of the insulating substrate 24 which is bonded to the electrodes 41a and 41b on the first main surfaces of the semiconductor elements 4, with the first bonding material layers 10a and 10b interposed therebetween. The wiring lines 23c and 23d connected to the bonding wires 5 are formed on the other surface of the insulating substrate 24.

The wiring lines 23a and 23b and the wiring lines 23c and 23d which are respectively formed on the one surface and the other surface of the insulating substrate 24 are connected to each other by conductive members 25 which are formed in through holes 22 provided in the insulating substrate 24.

The wiring lines 23a, 23b, 23c, and 23d are provided by forming a metal film which is made of one of metal materials, such as Au, Ag, Al, Cu, Cr, Ni, Sn, and solder, or one of combinations thereof on the insulating substrate 24 using a vapor deposition method, a sputtering method, or a plating method.

The conductive member 25 is made of one of metal materials, such as Au, Ag, Al, Cu, Cr, Ni, Sn, and solder, or one of combinations thereof, and is formed on at least the inner wall of the through hole 22.

The one surface of the electrode plate 6 is bonded to the electrodes 41a and 41b on the first main surfaces of a plurality of semiconductor elements 4 and the wiring lines 23c and 23d make it possible to ensure a wire bonding region larger than the electrode 41 on the first main surface of each semiconductor element 4.

The wiring lines 23a, 23b, 23c, and 23d are formed on the insulating substrate 24 of the electrode plate 6 and the electrodes 41a and 41b on the first main surface of each semiconductor element 4 are connected to the wiring lines 23a and 23b. Therefore, it is possible to reduce the number of bonding wires 5 for connecting the electrode plate 6 and the second lead terminals 3a and 3b.

Since the electrode plate 6 includes the wiring lines 23a, 23b, 23c, and 23d, a plurality of semiconductor elements 4, each of which has two electrodes 41a and 41b on the first main surface, can be provided in one semiconductor device 30.

Embodiment 5

Figure 10:
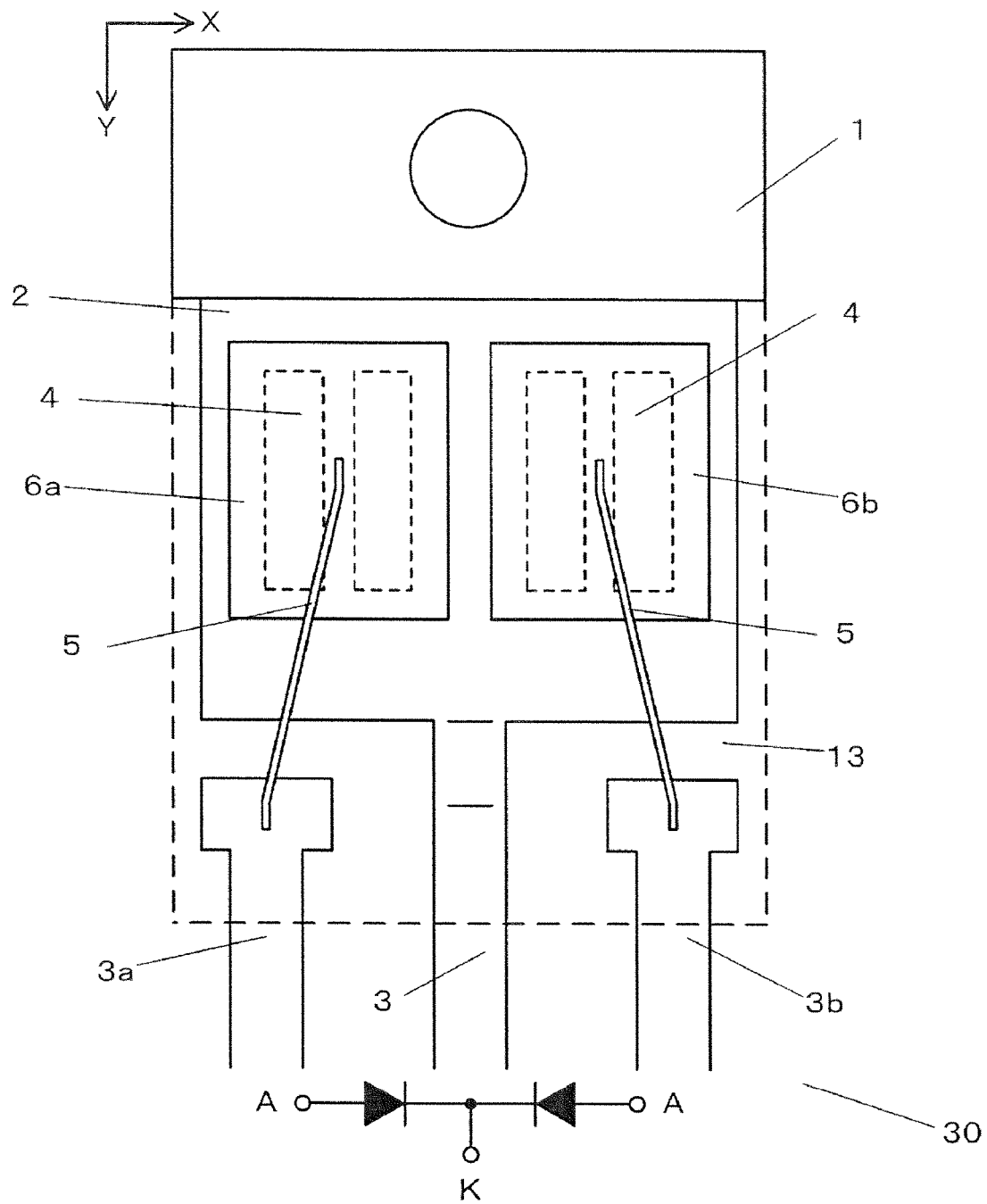
FIG. 10 is a plan view illustrating Embodiment 5 of the invention.
Figure 11:
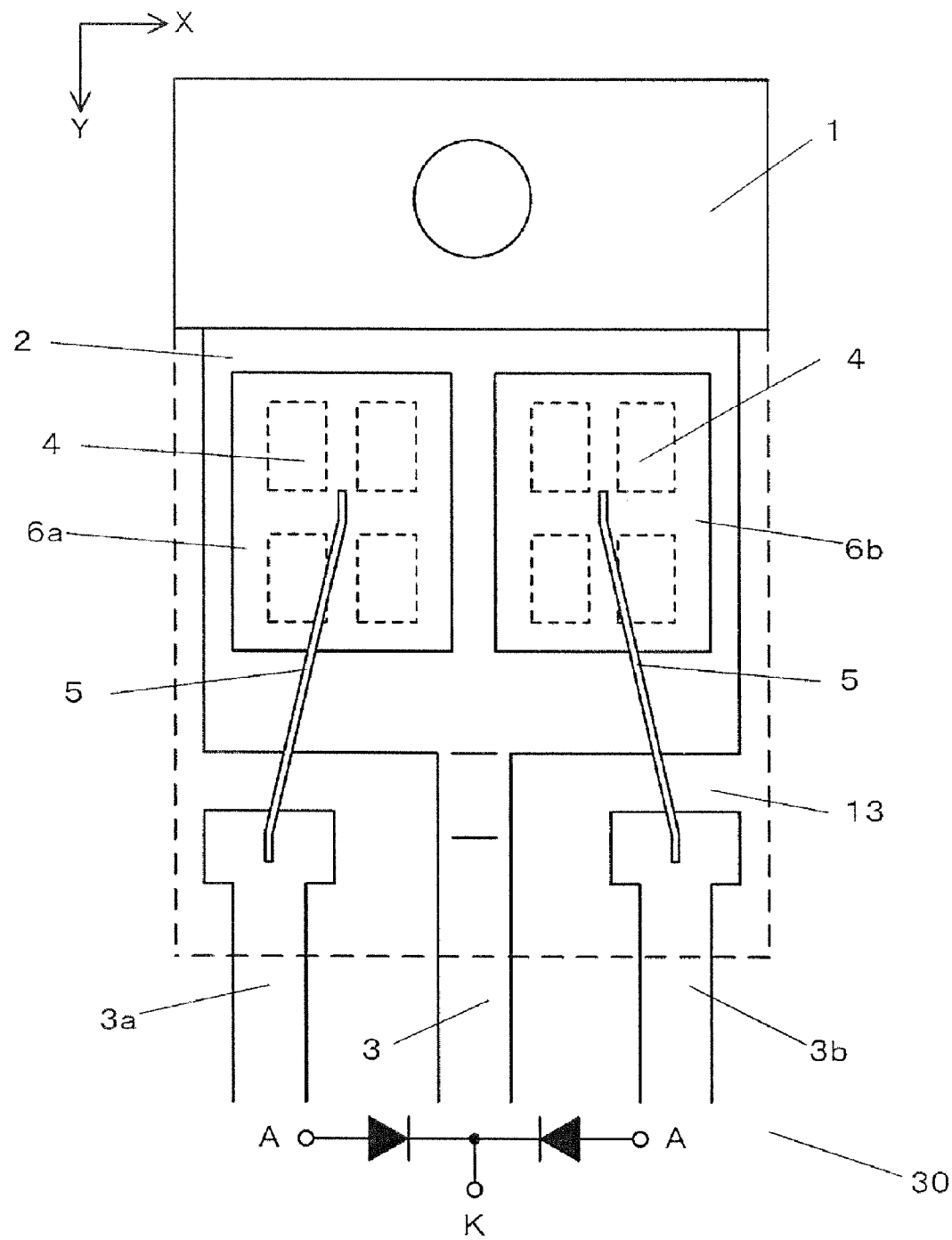
FIG. 11 is a plan view illustrating Embodiment 5 of the invention.

FIGS. 10 and 11 are plan views illustrating Embodiment 5 of the invention and illustrate modifications of Embodiment 1.

In FIG. 10, two or more mounted semiconductor elements 4 are vertically long and are arranged in parallel to the X direction of a coordinate system illustrated in FIG. 10. The semiconductor element 4 is arranged such that the longitudinal direction thereof is parallel to the Y direction of the coordinate system illustrated in FIG. 10. Electrodes 41 on the first main surfaces of the semiconductor elements 4 are separately bonded to an electrode plate 6a and an electrode plate 6b. The electrode plates 6a and 6b and second lead terminals 3a and 3b are connected to each other by bonding wires 5.

As illustrated in FIGS. 3B and 3C, convex portions 14a or 14b may be provided on one surface of each of the electrode plates 6a and 6b.

In FIG. 11, two or more semiconductor elements 4 are arranged in two rows in the Y direction of a coordinate system illustrated in FIG. 11 and are arranged in parallel to the X direction of the coordinate system illustrated in FIG. 11.

Electrodes 41 on the first main surfaces of the semiconductor elements 4 are separately bonded to an electrode plate 6a and an electrode plate 6b. The electrode plates 6a and 6b and second lead terminals 3a and 3b are connected to each other by bonding wires 5.

As illustrated in FIGS. 3B and 3C, convex portions 14a or 14b may be provided on one surface of each of the electrode plates 6a and 6b.

Since the electrode plate 6 is divided into the electrode plate 6a and the electrode plate 6b, the second lead terminals 3a and 3b can be used as an anode terminal and the first lead terminal 3 can be used as cathode terminal, similarly to the related art illustrated in FIG. 20.

Embodiment 6

FIGS. 12A-12G are diagrams illustrating Embodiment 6 of the invention and illustrate a method for manufacturing the semiconductor device according to Embodiment 1.

Figure 12A:
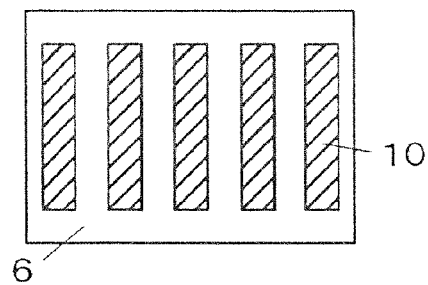
FIGS. 12A, 12B, 12C, 12D, 12E, 12F and 12G are diagrams illustrating a manufacturing method according to the embodiment of the invention.

As illustrated in FIG. 12A, the first bonding material layer 10 is formed on one surface of the electrode plate 6. The bonding material layer 10 is formed by, for example, screen printing using a metal mask or a coating method using a dispenser.

The first bonding material layer 10 is solder paste with high thermal conductivity or silver-based conductive paste and has a thickness of about 100 µm.

Figure 12B:
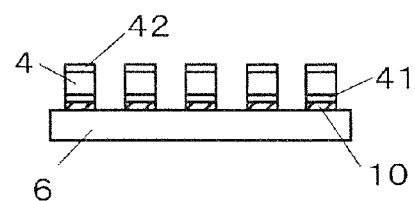

Then, as illustrated in FIG. 12B, the electrode 41 on the first main surface of the semiconductor element 4 is arranged on the first bonding material layer 10 and is bonded by a heating process in a reflow furnace.

Figure 12C:
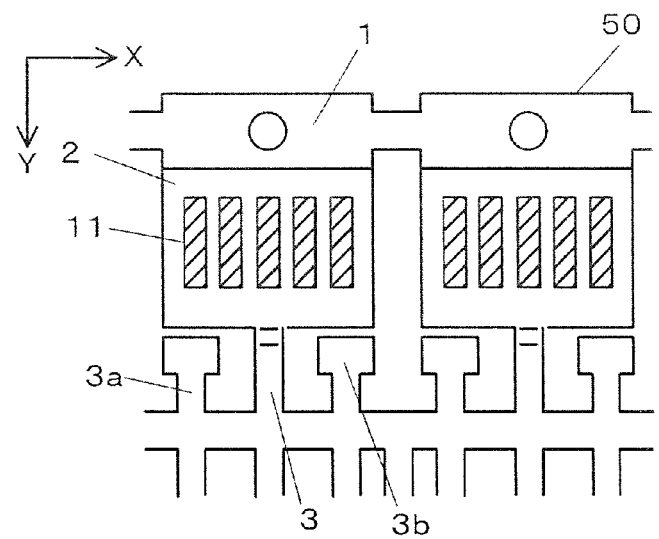

Then, as illustrated in FIG. 12C, the second bonding material layer 11 is formed on the semiconductor element bonding portion 2 of the conductive plate 1. The second bonding material layer 11 is formed by, for example, screen printing using a metal mask or a coating method using a dispenser.

The second bonding material layer 11 is solder paste with high thermal conductivity or silver-based conductive paste and has a thickness of about 100 µm.

Figure 12D:
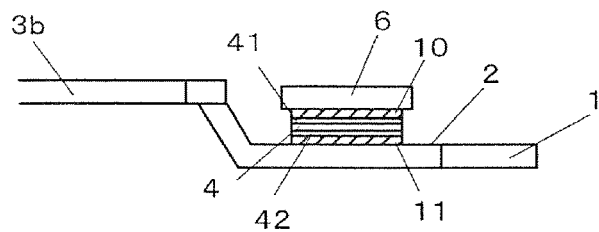

Then, as illustrated in FIG. 12D, the electrode 42 on the second main surface of the semiconductor element 4 bonded to the one surface of the electrode plate 6 is arranged on the second bonding material layer 11 and is bonded by a heating process in a reflow furnace.

When the electrode 42 on the second main surface of the semiconductor element 4 bonded to the one surface of the electrode plate 6 is arranged on the second bonding material layer 11, the electrode 41 on the first main surface of the semiconductor element 4 is connected to the one surface of the electrode plate 6 in advance, as illustrated in FIG. 12B. Therefore, the first bonding material layer 10 and the semiconductor element 4 fall to the one surface of the electrode plate 6 by their own weight. As a result, it is possible to improve the accuracy of mounting.

Figure 12E:
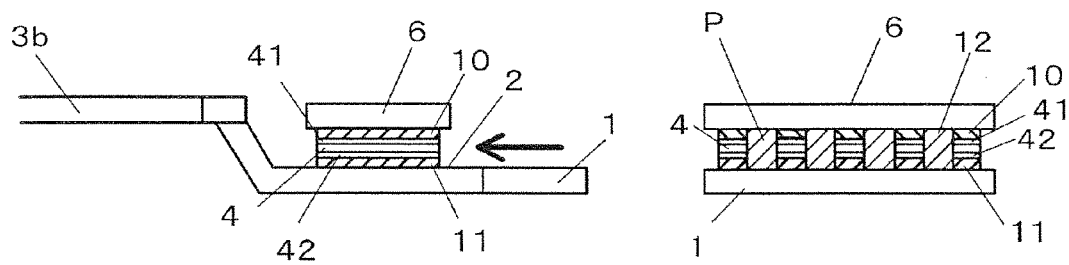

Then, as illustrated in FIG. 12E, the resin 12 is injected into the space P surrounded by the semiconductor elements 4, the one surface of the electrode plate 6, and the semiconductor element bonding portion 2 of the conductive plate 1 in the direction of an arrow illustrated in FIG. 12E. Then, the resin 12 is hardened by a heating process. The injected resin 12 reduces mechanical impact during wire bonding.

The resin 12 includes a filler, similarly to the molding resin 13. The resin 12 which includes a filler with a smaller diameter than the filler included in the molding resin 13 and can be filled in the space P surrounded by the semiconductor elements 4, the semiconductor element bonding portion 2 of the conductive plate 1, and the one surface of the electrode plate 6 is selected. When the diameter of the filler included in the molding resin 13 is greater than the space P, it is difficult to fill the space P with the molding resin 13 during resin sealing. Therefore, the space P which is not filled with the molding resin 13 during resin sealing is filled with the resin 12. As a result, it is possible to reduce the possibility of a crack occurring due to a reliability test, such as a heat cycle test or a heat shock test, for a portion which is not filled with the molding resin 13.

It is preferable that the resin 12 be a thermosetting resin having the same linear expansion coefficient as the molding resin 13 in order to suppress the occurrence of a crack. Therefore, in the embodiment of the invention, the resin 12 is an epoxy-based resin, similarly to the molding resin 13.

Figure 12F:
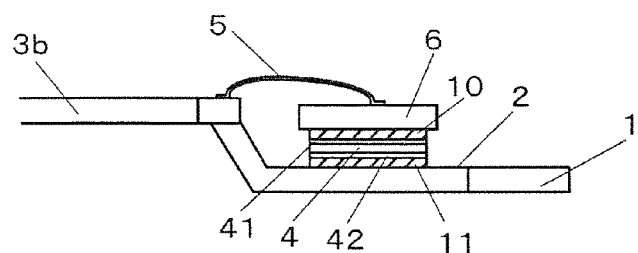

Then, as illustrated in FIG. 12F, the other surface of the electrode plate 6 is connected to the second lead terminal 3*a* or the second lead terminal 3*b* by the bonding wire 5.

It is preferable that the bonding wire 5 be made of Al, Cu, or Au with a large allowable current.

Figure 12G:
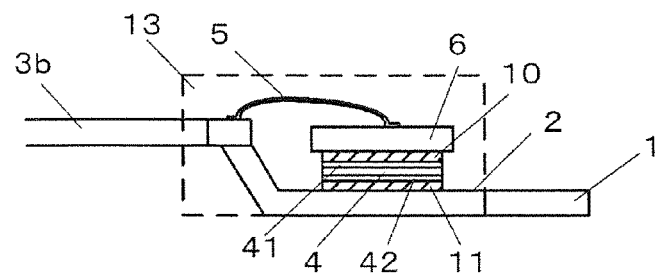

Then, as illustrated in FIG. 12G, the semiconductor element bonding portion 2 of the conductive plate 1, the second bonding material layer 11, the semiconductor elements 4, the electrode plate 6, and the bonding wires 5 are sealed by the molding resin 13. The resin sealing is performed such that the rear surface of the semiconductor element bonding portion 2 of the conductive plate 1 is exposed.

The resin sealing may be a full pack type in which the rear surface of the semiconductor element bonding portion 2 of the conductive plate 1 is not exposed.

It is preferable that the electrode plate 6 and a lead frame 50 that includes the second lead terminals 3*a* and 3*b* and the conductive plate 1 including the semiconductor element bonding portion 2 and the first lead terminal 3 be made of Cu or Al with high thermal conductivity, or alloys including Cu or Al. In addition, a plating process using Ni or a plating process using Sn-based solder may be performed on the surface of the lead frame and the electrode plate.

Similarly to the related art illustrated in FIG. 20, this manufacturing method can use the lead frame 50 in which the conductive plate 1 including the first lead terminal 3 and the semiconductor element bonding portion 2, which is a die pad, is connected to the second lead terminals 3*a* and 3*b*. Therefore, equipment investment for the new design or mold of the lead frame 50 is not required and it is possible to reduce costs.

Since the other surface of the electrode plate 6 is connected to the second lead terminals 3*a* and 3*b* by the bonding wires 5, positional deviation does not occur in the second lead terminals 3*a* and 3*b* even when the electrode plate 6 is inclined.

Since one surface of the electrode plate 6 is bonded to the electrodes 41 on the first main surfaces of a plurality of semiconductor elements 4, it is possible to ensure a wire bonding region larger than the electrodes 41 on the first main surfaces of the semiconductor elements 4. Therefore, it is possible to easily use the bonding wire 5 with a large diameter or the bonding wire 5 with a ribbon shape and to reduce the number of bonding wires, as compared to the related art.

Embodiment 7

Figure 13:
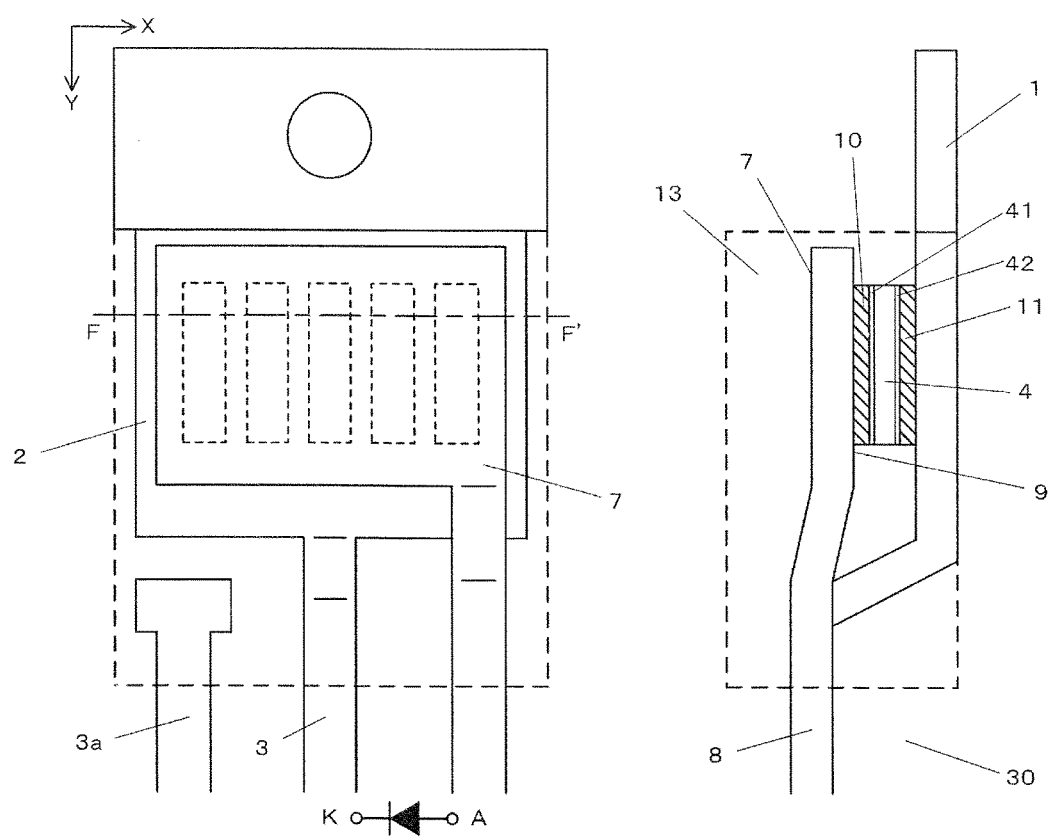
FIG. 13 is a plan view and a side view illustrating Embodiment 7 of the invention.

FIGS. 13 and 14 are diagrams illustrating Embodiment 7 of the invention. FIG. 13 is a plan view and a side view illustrating Embodiment 7 of the invention and FIG. 14 is a cross-sectional view taken along the line F-F' of FIG. 13.

A semiconductor device 30 is a TO package sealed with a resin, such as TO220. A first lead terminal 3 and a second lead terminal 3*a* are arranged in parallel to the Y direction of a coordinate system illustrated in the drawings.

The Y direction of the coordinate system illustrated in the drawings is the same as the injection direction of a molding resin 13 during resin sealing. As illustrated in the drawings, portions of the first lead terminal 3, the second lead terminal 3*a*, and a lead terminal 8, which will be described below, are exposed without being covered with the molding resin 13 and the first lead terminal 3, the second lead terminal 3*a*, and the lead terminal 8 serve as external terminals.

Two or more mounted semiconductor elements 4 are vertically long and are arranged in parallel to the X direction of the coordinate system illustrated in the drawings. The semiconductor elements 4 are arranged such that the longitudinal direction thereof is parallel to the Y direction of the coordinate system illustrated in the drawings.

As described above, since the vertically long semiconductor elements 4 are arranged such that the longitudinal direction thereof is parallel to the first lead terminal 3 and the second lead terminal 3*a*, it is possible to improve the fluidity of the molding resin 13.

Electrodes 42 on the second main surfaces of the two or more semiconductor elements 4 are bonded to a semiconductor element bonding portion 2 of a conductive plate 1, with a second bonding material layer 11 interposed therebetween.

Electrodes 41 on the first main surfaces of the two or more semiconductor elements 4 and an electrode plate 7 are bonded to each other, with a first bonding material layer 10 interposed therebetween, and are sealed by the molding resin 13. The electrode plate 7 includes the lead terminal 8 and a bonding portion 9 which is provided on one surface and is bonded to the electrodes 41 on the first main surfaces of two or more semiconductor elements 4, with the first bonding material layer 10 interposed therebetween. The bonding portion 9 is bonded to the electrodes 41 on the first main surfaces of a plurality of semiconductor elements 4 so as to extend over the electrodes 41.

Figure 14A:
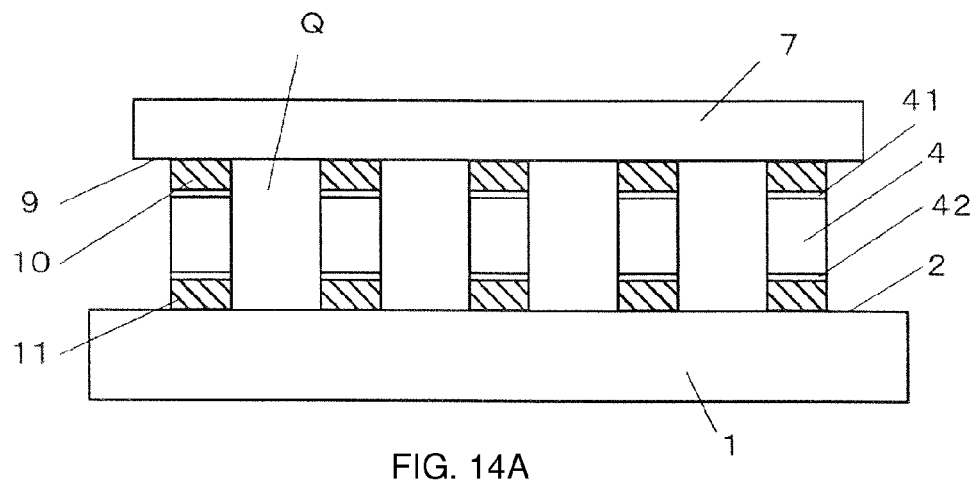
FIGS. 14A, 14B and 14C are cross-sectional views taken along the line F-F' of FIG. 13.
Figure 14B:
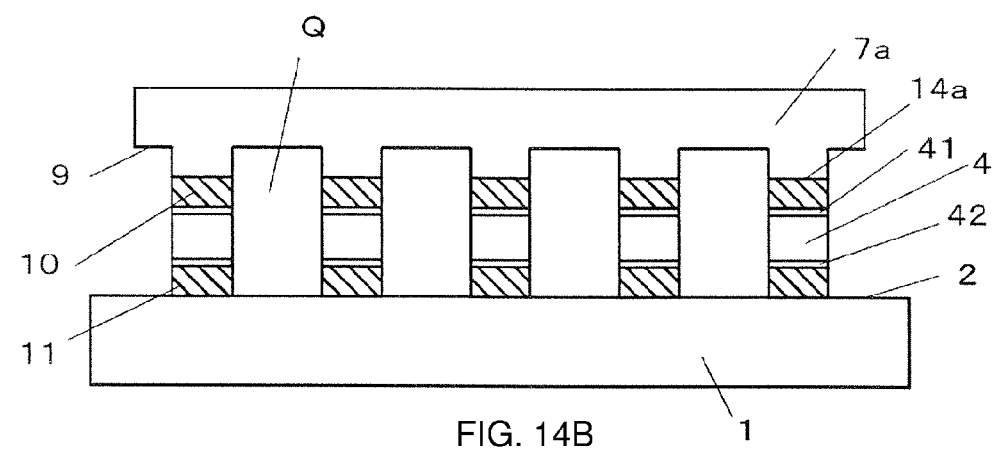
Figure 14C:
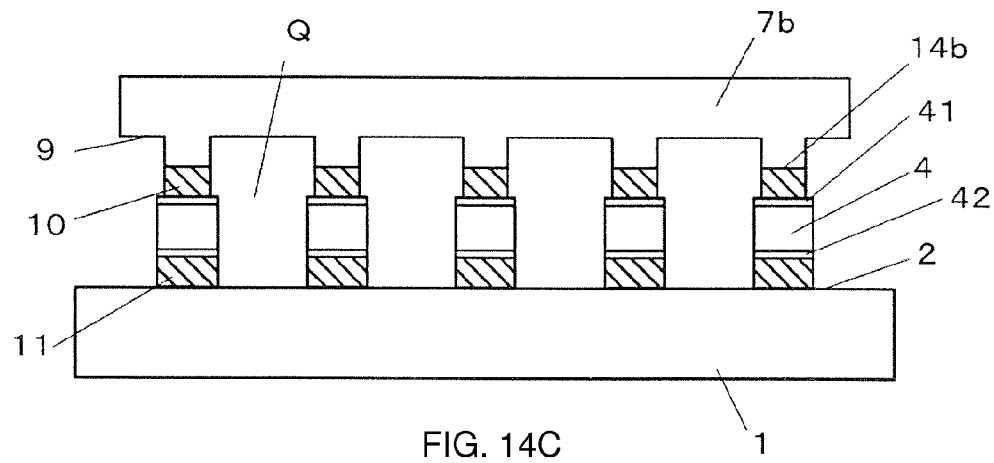

The bonding portion 9 of the electrode plate 7 may be flat, as illustrated in FIG. 14A, or convex portions 14a and 14b may be formed on the bonding portion 9, as illustrated in FIGS. 14B and 14C. When the convex portions 14a or 14b are formed on the bonding portion 9 of the electrode plate 7, the electrodes 41 on the first main surfaces of the semiconductor elements 4 are bonded to the convex portions 14a or 14b, and the thickness of the mounted semiconductor element 4 is reduced, the gap between the semiconductor element bonding portion 2 of the conductive plate 1 and the bonding portion 9 of an electrode plate 7a or 7b can be more than the diameter of a filler in the molding resin 13. As a result, it is possible to improve the fluidity of the molding resin 13 during resin sealing.

As illustrated in FIG. 14C, when the convex portion 14b is smaller than the electrode 41 on the first main surface of the semiconductor element, it is possible to prevent the first bonding material layer 10 from being attached to the side surface of the semiconductor element 4.

It is preferable that the first bonding material layer 10 and the second bonding material layer 11 be solder paste with high thermal conductivity or silver-based conductive paste.

It is preferable that the electrode plate 7 including the lead terminal 8 and the bonding portion 9 be made of Cu or Al with high thermal conductivity, or alloys including Cu or Al. A plating process using Ni or a plating process using Sn-based solder may be performed on the surfaces thereof.

It is preferable that the conductive plate 1 including the semiconductor element bonding portion 2 and the first lead terminal 3 and the second lead terminal 3a be made of Cu or Al with high thermal conductivity, or alloys including Cu or Al. A plating process using Ni or a plating process using Sn-based solder may be performed on the surfaces thereof.

When a space Q which is surrounded by the semiconductor elements 4, the bonding portion 9 of the electrode plate 7, and the semiconductor element bonding portion 2 of the conductive plate 1 is less than the diameter of the filler in the molding resin 13 or when there is a portion in which the fluidity of the molding resin 13 is reduced due to the arrangement of the semiconductor elements 4, the space Q may be filled with the resin 12.

Since the space Q which is not filled with the molding resin 13 is filled with the resin 12, it is possible to reduce the possibility of a crack occurring due to a reliability test, such as a heat cycle test or a heat shock test, for a portion which is not filled with the molding resin 13.

It is preferable that the resin 12 be a thermosetting resin having the same linear expansion coefficient as the molding resin 13 in order to suppress the occurrence of a crack. Therefore, in the embodiment of the invention, the resin 12 is an epoxy-based resin, similarly to the molding resin 13. In addition, the resin 12 which includes a filler with a smaller diameter than the filler in the molding resin 13 and can be filled in the space Q is selected.

Since the lead terminal 8 is provided in the electrode plate 7, the connection between the electrode plate 7 and the lead terminal 8 by the bonding wire 5 is not needed and it is possible to reduce the number of manufacturing processes.

Embodiment 8

Figure 15:
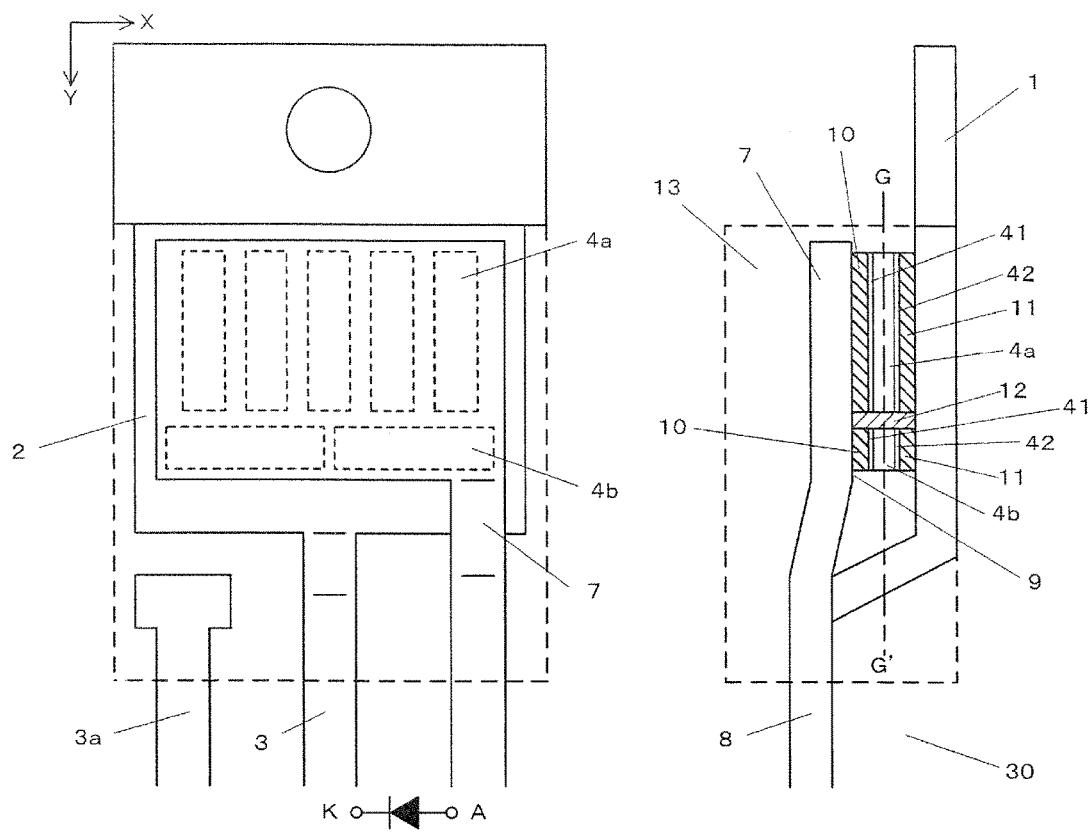
FIG. 15 is a plan view and a side view illustrating Embodiment 8 of the invention.
Figure 16:
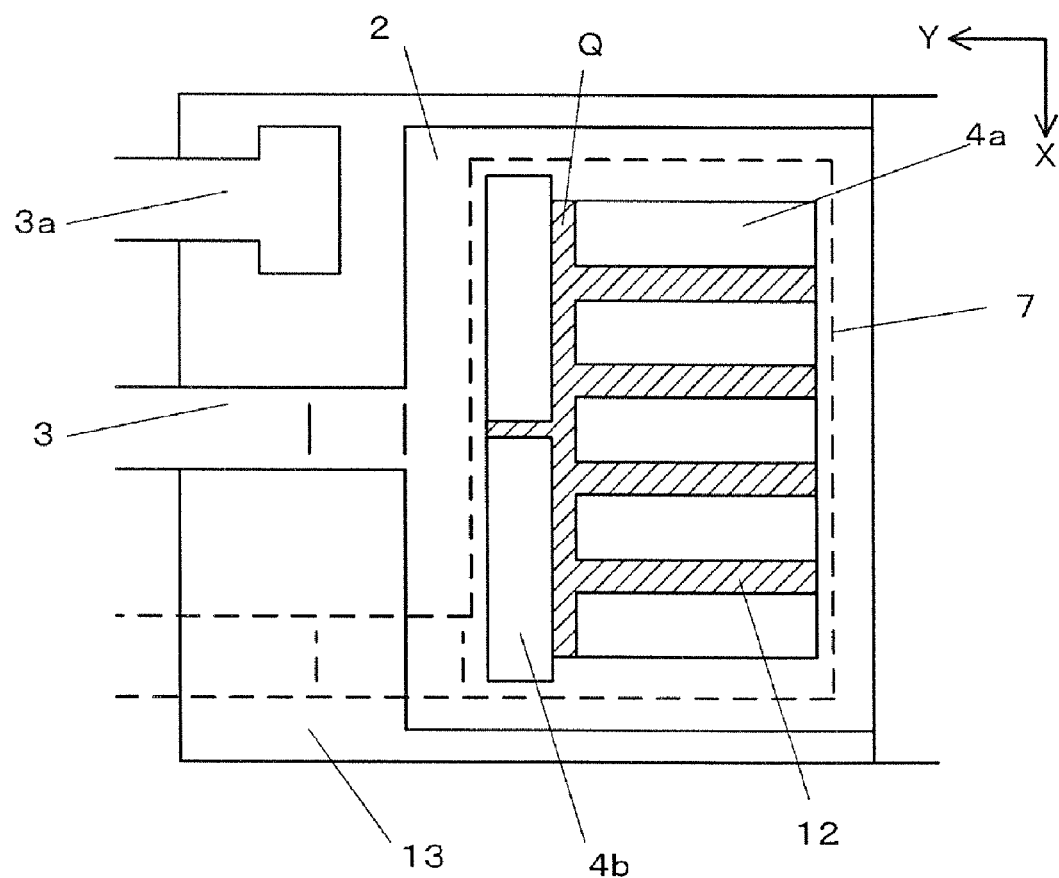
FIG. 16 is a cross-sectional view taken along the line G-G' of FIG. 15.

FIGS. 15 and 16 are diagrams illustrating a structure according to Embodiment 8 of the invention and illustrate a modification of Embodiment 7. FIG. 15 is a plan view and a side view illustrating Embodiment 8 of the invention. FIG. 16 is a cross-sectional view taken along the line G-G' of FIG. 15.

Semiconductor elements 4a and 4b are vertically long and are arranged in parallel to the X direction of a coordinate system illustrated in the drawings. The semiconductor elements 4a are arranged such that the longitudinal direction thereof is parallel to the Y direction of the coordinate system illustrated in the drawings. The semiconductor elements 4b are arranged such that the longitudinal direction thereof is parallel to the X direction of the coordinate system illustrated in the drawings.

A resin 12 is injected into a space which is surrounded by the semiconductor elements 4a, a semiconductor element bonding portion 2 of a conductive plate 1, and a bonding portion 9 of an electrode plate 7 and a space Q which is surrounded by the semiconductor elements 4a and 4b, the semiconductor element bonding portion 2 of the conductive plate 1, and the bonding portion 9 of the electrode plate 7.

In this case, the semiconductor element 4b can prevent the resin 12 which is injected in the Y direction of the coordinate system illustrated in the drawings from flowing from the semiconductor element bonding portion 2 of the conductive plate 1.

Since the space Q which is not filled with the molding resin 13 during resin sealing is filled with the resin 12, it is possible to reduce the possibility of a crack occurring due to a reliability test, such as a heat cycle test or a heat shock test, for a portion which is not filled with the molding resin 13.

It is preferable that the resin 12 be a thermosetting resin having the same linear expansion coefficient as the molding resin 13 in order to suppress the occurrence of a crack. Therefore, in the embodiment of the invention, the resin 12 is an epoxy-based resin, similarly to the molding resin 13. The resin 12 which includes a filler with a smaller diameter the filler included in the molding resin 13 and can be filled in the space Q surrounded by the semiconductor elements 4a and 4b, the semiconductor element bonding portion 2 of the conductive plate 1, and one surface of the electrode plate 7 is selected.

As illustrated in FIGS. 14B and 14C, convex portions 14a and 14b may be provided on the bonding portion 9 of the electrode plate 7 in bonding parts to the first main surfaces of the semiconductor elements 4, in accordance with the arrangement of the semiconductor elements 4.

Embodiment 9

Figure 17:
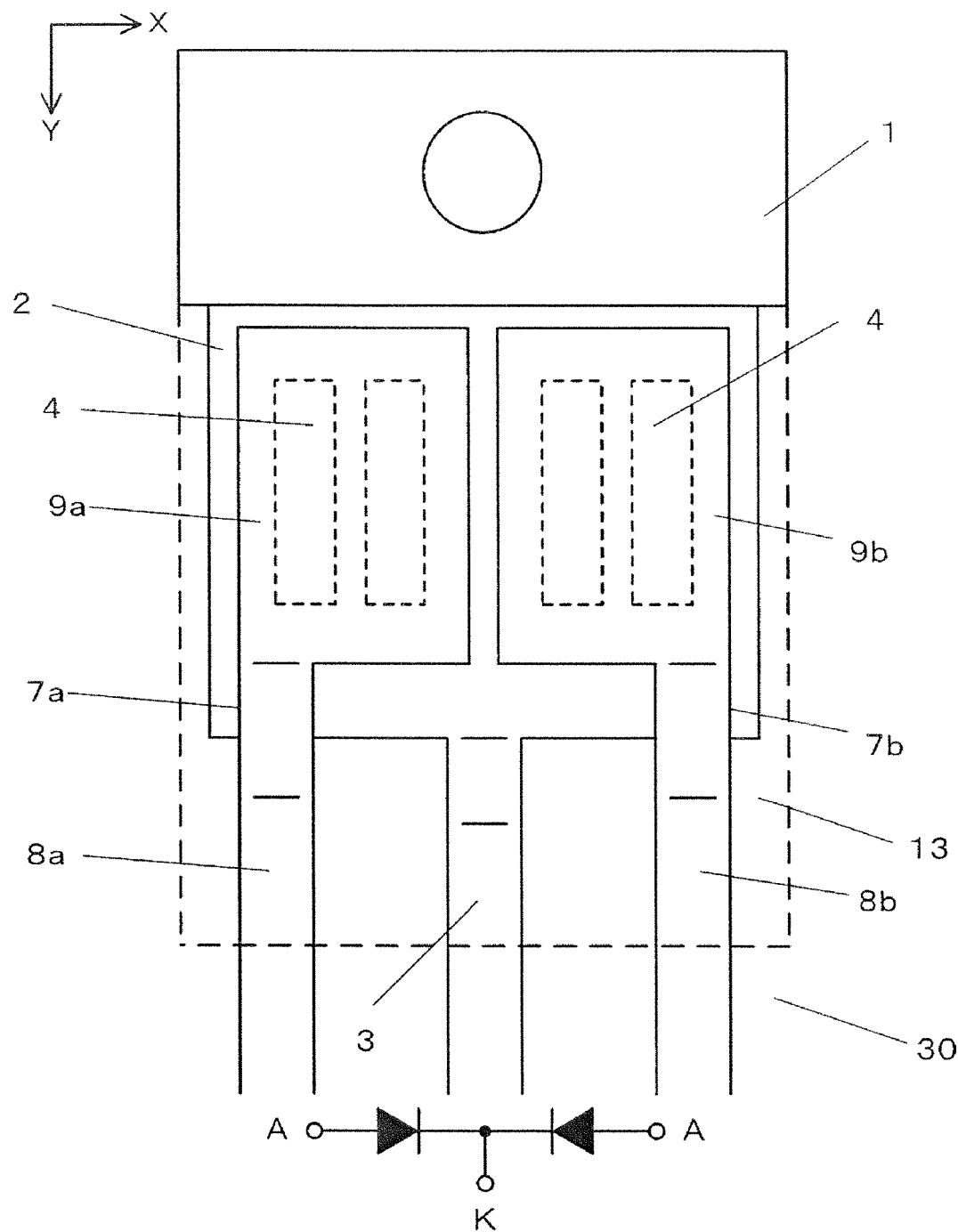
FIG. 17 is a plan view illustrating Embodiment 9 of the invention.

FIG. 17 is a plan view illustrating Embodiment 9 of the invention and illustrates a modification of Embodiment 7.

Two or more mounted semiconductor elements 4 are vertically long and are arranged in parallel to the X direction of a coordinate system illustrated in FIG. 17. The semiconductor elements 4 are arranged such that the longitudinal direction thereof is parallel to the Y direction of the coordinate system illustrated in FIG. 17.

The Y direction of the coordinate system illustrated in FIG. 17 is the same as the injection direction of a molding resin 13 during resin sealing.

Electrodes 41 on the first main surfaces of the semiconductor elements 4 are separately bonded to a bonding portion 9a of an electrode plate 7a and a bonding portion 9b of an electrode plate 7b.

As illustrated in FIGS. 14C and 14C, the bonding portions 9a and 9b may include convex portions 14a and 14b which are bonded to the electrodes 41 on the first main surfaces of the semiconductor elements 4.

Since the electrode plate is divided into the electrode plate 7a and the electrode plate 7b, a lead terminal 8a of the electrode plate 7a can be used as an anode terminal, a first lead terminal 3 of a conductive plate 1 can be used as a cathode terminal, and a lead terminal 8b of the electrode plate 7b can be used as the anode terminal, similarly to the related art illustrated in FIG. 20.

Since the vertically long semiconductor elements 4 are arranged such that the longitudinal direction thereof is parallel to the Y direction of the coordinate system illustrated in FIG. 17, which is the injection direction of the molding resin 13, it is possible to improve the fluidity of the molding resin 13 during resin sealing.

When a space which is surrounded by the semiconductor elements 4, the bonding portion 9a of the electrode plate 7a, the bonding portion 9b of the electrode plate 7b, and the semiconductor element bonding portion 2 of the conductive plate 1 is less than the diameter of the filler in the molding resin 13 or when there is a portion in which the fluidity of the molding resin 13 is reduced due to the arrangement of the semiconductor elements 4, the space may be filled with the resin 12.

Since the space Q which is not filled with the molding resin 13 is filled with the resin 12, it is possible to reduce the possibility of a crack occurring due to a reliability test, such as a heat cycle test or a heat shock test, for a portion which is not filled with the molding resin 13.

It is preferable that the resin 12 be a thermosetting resin having the same linear expansion coefficient as the molding resin 13 in order to suppress the occurrence of a crack. Therefore, in the embodiment of the invention, the resin 12 is an epoxy-based resin, similarly to the molding resin 13. In addition, the resin 12 which includes a filler with a smaller diameter than the filler in the molding resin 13 and can be filled in the space Q is selected.

Since the lead terminals 8a and 8b are respectively provided in the electrode plates 7a and 7b, the connection between the electrode plates 7a and 7b and the lead terminals 8a and 8b by the bonding wires 5 is not needed and it is possible to reduce the number of manufacturing processes.

Embodiment 10

Figure 18:
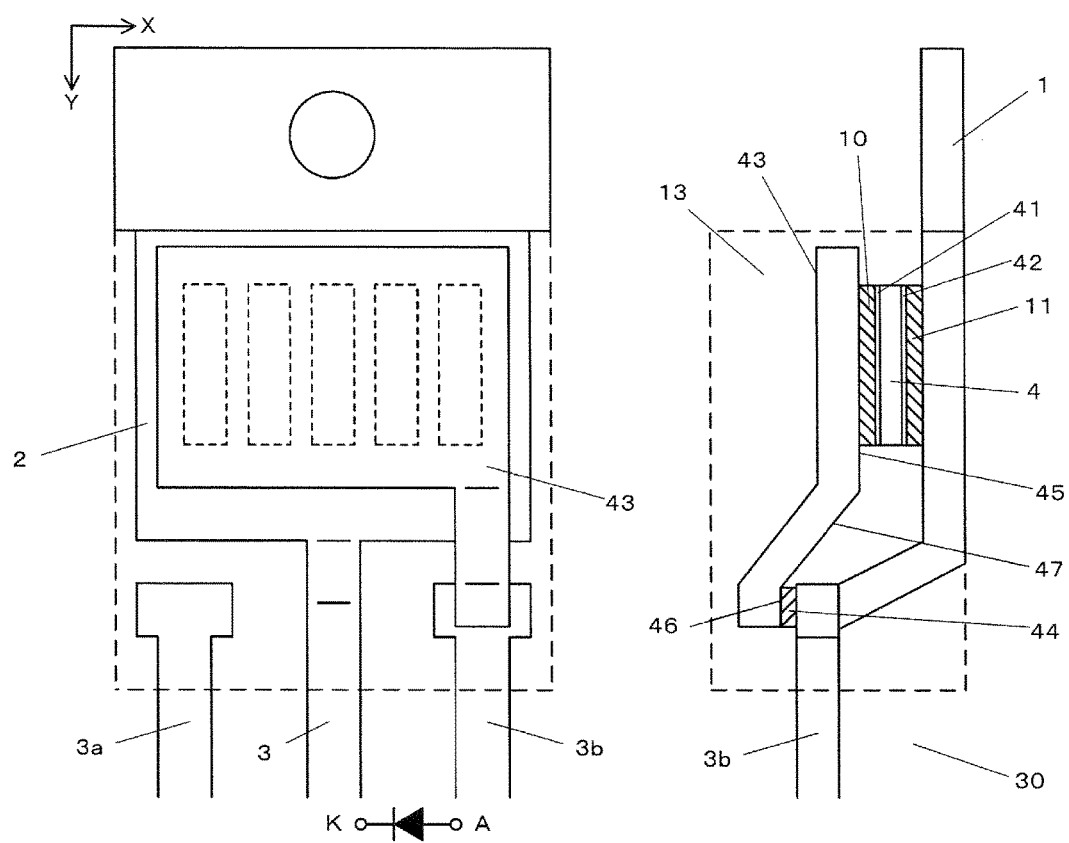
FIG. 18 is a plan view and a side view illustrating Embodiment 10 of the invention.

FIG. 18 is a plan view and a side view illustrating Embodiment 10 of the invention and illustrates a modification of Embodiment 7.

A semiconductor device 30 is a TO package sealed with a resin, such as TO220. A first lead terminal 3 and second lead terminals 3a and 3b are arranged in parallel to the Y direction of a coordinate system illustrated in FIG. 18.

The Y direction of the coordinate system illustrated in FIG. 18 is the same as the injection direction of a molding resin 13 during resin sealing. As illustrated in FIG. 18, portions of the first lead terminal 3 the second lead terminals 3a and 3b are exposed without being covered with the molding resin 13 and the first lead terminal 3 the second lead terminals 3a and 3b serve as external terminals.

Two or more mounted semiconductor elements 4 are vertically long and are arranged in parallel to the X direction of the coordinate system illustrated in FIG. 18. The semiconductor elements 4 are arranged such that the longitudinal direction thereof is parallel to the Y direction of the coordinate system illustrated in FIG. 18.

As described above, since the vertically long semiconductor elements 4 are arranged such that the longitudinal direction thereof is parallel to the first lead terminal 3 and the second lead terminals 3a and 3b, it is possible to improve the fluidity of the molding resin 13.

Electrodes 42 on the second main surfaces of the two or more semiconductor elements 4 are bonded to a semiconductor element bonding portion 2 of a conductive plate 1, with a second bonding material layer 11 interposed therebetween.

Electrodes 41 on the first main surfaces of the two or more semiconductor elements 4 and an electrode plate 43 are bonded to each other, with a first bonding material layer 10 interposed therebetween, and are sealed by the molding resin 13. The electrode plate 43 includes a connection portion 46 which is connected to the lead terminal 3b and a bonding portion 45 which is provided on one surface and is bonded to the electrodes 41 on the first main surfaces of the two or more semiconductor elements 4, with the first bonding material layer 10 interposed therebetween. The bonding portion 45 is bonded to the electrodes 41 on the first main surfaces of a plurality of semiconductor elements 4 so as to extend over the electrodes 41. A bent portion 47 with a curved shape is provided between the connection portion 46 and the bonding portion 45. The connection portion 46 extends from the bonding portion 45 through the bent portion 47.

The connection portion 46 of the electrode plate 43 is bonded to the second lead terminal 3a, with a third bonding material layer 44 interposed therebetween, and is sealed by the molding resin 13.

The bonding portion 45 of the electrode plate 43 may be flat as illustrated in FIG. 14A or convex portions 14a and 14b may be provided on the bonding portion 45, as illustrated in FIGS. 14B and 14C.

It is preferable that the first bonding material layer 10, the second bonding material layer 11, and the third bonding material layer 44 be solder paste with high thermal conductivity or silver-based conductive paste.

It is preferable that the electrode plate 43 including the bonding portion 45 and the connection portion 46 be made of Cu or Al with high thermal conductivity or alloys including Cu or Al. A plating process using Ni or a plating process using Sn-based solder may be performed on the surfaces thereof.

It is preferable that the conductive plate 1 including the semiconductor element bonding portion 2 and the first lead terminal 3 and the second lead terminals 3a and 3b be made of Cu or Al with high thermal conductivity or alloys including Cu or Al. A plating process using Ni or a plating process using Sn-based solder may be performed on the surfaces thereof.

When a space which is surrounded by the semiconductor elements 4, the bonding portion 45 of the electrode plate 43, and the semiconductor element bonding portion 2 of the conductive plate 1 is less than the diameter of the filler in the molding resin 13 or when there is a portion in which the fluidity of the molding resin 13 is reduced due to the arrangement of the semiconductor elements 4, the space may be filled with the resin 12.

Similarly to the molding resin 13, the resin 12 includes a filler. The resin 12 which includes a filler with a smaller diameter than the filler included in the molding resin 13 and can be filled in the space surrounded by the semiconductor elements 4, the bonding portion 45 of the electrode plate 43, and the semiconductor element bonding portion 2 of the conductive plate 1 is selected. When the diameter of the filler included in the molding resin 13 is greater than the space, it is difficult to fill the space with the molding resin 13 during resin sealing. Therefore, the space which is not filled with the molding resin 13 is filled with the resin 12. As a result, it is possible to reduce the possibility of a crack occurring due to a reliability test, such as a heat cycle test or a heat shock test, for a portion which is not filled with the molding resin 13.

It is preferable that the resin 12 be a thermosetting resin having the same linear expansion coefficient as the molding resin 13 in order to suppress the occurrence of a crack. Therefore, in the embodiment of the invention, the resin 12 is an epoxy-based resin, similarly to the molding resin 13.

In the embodiment of the invention, since the connection portion 46 of the electrode plate 43 is bonded to the second lead terminal 3b, the connection between the electrode plate 43 and the second lead terminal 3b by the bonding wire 5 is not needed and it is possible to reduce the number of manufacturing processes.

Similarly to the related art, since the lead frame 50 in which the conductive plate 1 including the semiconductor element bonding portion 2 and the first lead terminal is connected to the second lead terminals 3a and 3b can be used, it is not necessary to design a new conductive plate 1 and thus reduce manufacturing costs.

Embodiment 11

FIGS. 19A-19F are diagrams illustrating Embodiment 11 of the invention and illustrate a method for manufacturing the semiconductor device according to Embodiment 7.

Figure 19A:
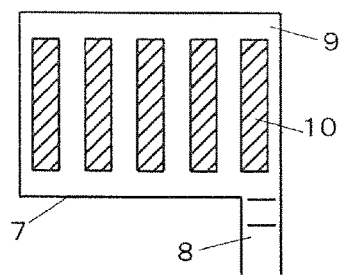
FIGS. 19A, 19B, 19C, 19D, 19E and 19F are diagrams illustrating a manufacturing method according to the embodiment of the invention

As illustrated in FIG. 19A, the first bonding material layer 10 is formed on the bonding portion 9 of the electrode plate 7 by, for example, screen printing using a metal mask or a coating method using a dispenser.

The first bonding material layer 10 is solder paste with high thermal conductivity or silver-based conductive paste and has a thickness of about 100 μm.

Figure 19B:
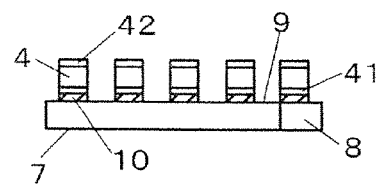

Then, as illustrated in FIG. 19B, the electrode 41 on the first main surface of the semiconductor element 4 is arranged on the first bonding material layer 10 and is bonded by a heating process in a reflow furnace.

Figure 19C:
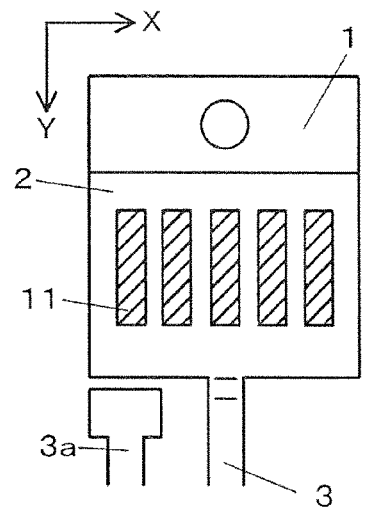

Then, as illustrated in FIG. 19C, the second bonding material layer 11 is formed on the semiconductor element bonding portion 2 of the conductive plate 1 by, for example, screen printing using a metal mask or a coating method using a dispenser.

The second bonding material layer 11 is solder paste with high thermal conductivity or silver-based conductive paste and has a thickness of about 100 μm.

Figure 19D:
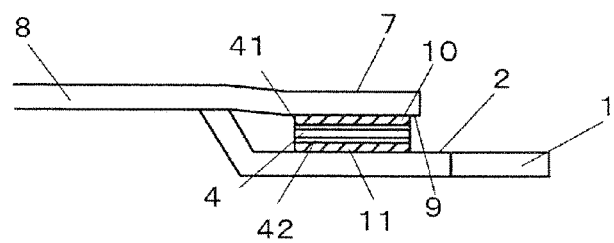

Then, as illustrated in FIG. 19D, the electrode 42 on the second main surface of the semiconductor element 4 bonded to the bonding portion 9 of the electrode plate 7 is arranged on the second bonding material layer 11 and is bonded by a heating process in a reflow furnace.

When the electrode 42 on the second main surface of the semiconductor element 4 bonded to the bonding portion 9 of the electrode plate 7 is arranged on the second bonding material layer 11, the electrode 41 on the first main surface of the semiconductor element 4 is connected to the bonding portion 9 of the electrode plate 7 in advance, as illustrated in FIG. 19B. Therefore, the first bonding material layer 10 and the semiconductor element 4 fall to the bonding portion 9 of the electrode plate 7 by their own weight. As a result, it is possible to improve the accuracy of mounting.

Figure 19E:
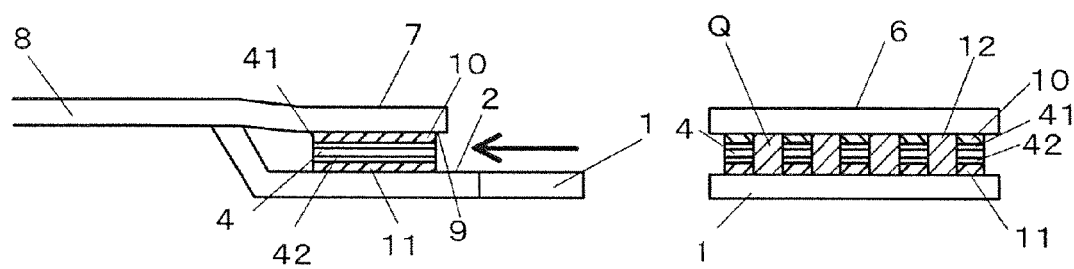

Then, as illustrated in FIG. 19E, the resin 12 is injected into the space Q surrounded by the semiconductor elements 4, the bonding portion 9 of the electrode plate 7, and the semiconductor element bonding portion 2 of the conductive plate 1 in the direction of an arrow illustrated in FIG. 19E. Then, the resin 12 is hardened by a heating process.

It is preferable that the resin 12 be a thermosetting resin having the same linear expansion coefficient as the molding resin 13 in order to suppress the occurrence of a crack. Therefore, in the embodiment of the invention, the resin 12 is an epoxy-based resin, similarly to the molding resin 13. In addition, the resin 12 which includes a filler with a smaller diameter than the filler in the molding resin 13 and can be filled in the space Q surrounded by the semiconductor elements 4, the semiconductor element bonding portion 2 of the conductive plate 1, and bonding portion 9 of the electrode plate 7 is selected.

Since the space Q which is not filled with the molding resin 13 is filled with the resin 12, it is possible to reduce the possibility of a crack occurring due to a reliability test, such as a heat cycle test or a heat shock test, for a portion which is not filled with the molding resin 13.

Figure 19F:
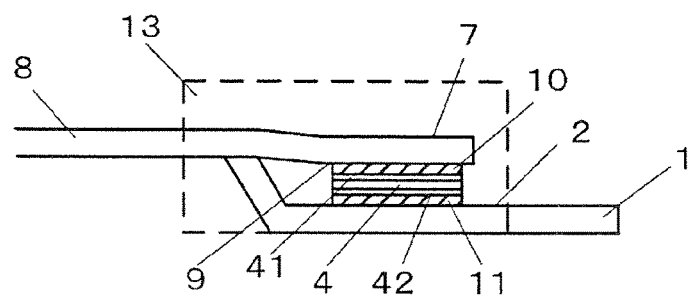

Then, as illustrated in FIG. 19F, the semiconductor element bonding portion 2 of the conductive plate 1, the second bonding material layer 11, the semiconductor elements 4, the first bonding material layer 10, and the bonding portion 9 of the electrode plate 7 are sealed by the molding resin 13. The resin sealing is performed such that the rear surface of the semiconductor element bonding portion 2 of the conductive plate 1 is exposed.

The resin sealing may be a full pack type in which the rear surface of the semiconductor element bonding portion 2 of the conductive plate 1 is not exposed.

Since the semiconductor elements 4 are vertically long and are arranged such that the longitudinal direction thereof is parallel to the injection direction of the resin 12 or the molding resin 13, it is possible to improve the fluidity of the resin 12 or the molding resin 13.

It is preferable that the conductive plate 1 including the semiconductor element bonding portion 2 and the first lead terminal 3 and the electrode plate 7 including the lead terminal 8 and the bonding portion 9 be made of Cu or Al with high thermal conductivity or alloys including Cu or Al. A plating process using Ni or a plating process using Sn-based solder may be performed on the surfaces thereof.

Since the electrode plate 7 including the lead terminal 8 and the bonding portion 9, a wire bonding step is not needed and it is possible to reduce the number of manufacturing processes.

EXPLANATIONS OF LETTERS OR NUMERALS

1 CONDUCTIVE PLATE
2 SEMICONDUCTOR ELEMENT BONDING PORTION
3 FIRST LEAD TERMINAL
3a, 3b SECOND LEAD TERMINAL
4, 4a, 4b SEMICONDUCTOR ELEMENT
5 BONDING WIRE
6, 6a and 6b ELECTRODE PLATE
7, 7a, 7b ELECTRODE PLATE
8, 8a, 8b LEAD TERMINAL
9, 9a, 9b BONDING PORTION
10, 10a, 10b FIRST BONDING MATERIAL LAYER
11 SECOND BONDING MATERIAL LAYER
12 RESIN
13 MOLDING RESIN
14a and 14b CONVEX PORTION
22 THROUGH HOLE
23a, 23b, 23c, 23d WIRING LINE
24 INSULATING SUBSTRATE
25 CONDUCTIVE MEMBER
30 SEMICONDUCTOR DEVICE 41 ELECTRODE ON FIRST MAIN SURFACE
42 ELECTRODE ON SECOND MAIN SURFACE
43 ELECTRODE PLATE
44 THIRD BONDING MATERIAL LAYER
45 BONDING PORTION
46 CONNECTION PORTION
47 BENT PORTION
50 LEAD FRAME
A ANODE
K CATHODE
P SPACE
Q SPACE

What is claimed is:

1. A semiconductor device comprising:
two or more semiconductor elements each of which has electrodes on a first main surface and a second main surface;
an electrode plate that has one surface which is bonded to the first main surfaces of the two or more semiconductor elements, with a first bonding material layer interposed therebetween;
a conductive plate that includes a first lead terminal and a semiconductor element bonding portion forming a portion of a surface of the conductive plate which is bonded directly by a second bonding material layer to the second main surfaces of the two or more semiconductor elements; and
a second lead terminal that is connected to another surface of the electrode plate by a bonding wire.

2. The semiconductor device according to claim 1, wherein the semiconductor element bonding portion of the conductive plate, the second bonding material layer, the semiconductor elements, the first bonding material layer, the electrode plate, and the bonding wire are sealed by a molding resin.

3. The semiconductor device according to claim 1, wherein a space which is surrounded by the semiconductor elements, the electrode plate, and the conductive plate is filled with a resin.

4. The semiconductor device according to claim 1, wherein the electrode plate includes an insulating substrate, wiring lines which are provided on two main surfaces of the insulating substrate, and a conductive member which is provided in a through hole formed in the insulating substrate and electrically connects the wiring lines on the two main surfaces of the insulating substrate.

5. The semiconductor device according to claim 1, wherein the electrode plate is made of Cu or Al, or alloys including Cu or Al.

6. The semiconductor device according to claim 5, wherein the electrode plate has convex portions provided on the one surface, and
the convex portions are provided on a bonding portion to the first main surfaces of the semiconductor elements.

7. A method for manufacturing the semiconductor device according to claim 1, comprising:
a first bonding material layer forming step of forming the first bonding material layer on the one surface of the electrode plate;
a first bonding step of arranging and bonding the first main surfaces of the two or more semiconductor elements to the first bonding material layer;
a second bonding material layer forming step of forming the second bonding material layer on the semiconductor element bonding portion of the conductive plate;
a second bonding step of arranging and bonding the second main surfaces of the semiconductor elements bonded to the electrode plate to the second bonding material layer;
a wire bonding step of connecting the other surface of the electrode plate and the second lead terminal with the bonding wire after the second bonding step; and
a molding step of sealing the semiconductor element bonding portion of the conductive plate, the second bonding material layer, the semiconductor elements, the first bonding material layer, the electrode plate, and the bonding wire with a molding resin.

8. The method for manufacturing the semiconductor device according to claim 7, further comprising:
a resin filling step of injecting a resin into a space which is surrounded by the semiconductor elements, the electrode plate, and the conductive plate between the second bonding step and the wire bonding step and hardening the resin.

9. A semiconductor device comprising:
two or more semiconductor elements each of which has electrodes on a first main surface and a second main surface;
an electrode plate that includes a first lead terminal and a bonding portion which is formed on one surface and is bonded to the first main surfaces of the two or more semiconductor elements, with a first bonding material layer interposed therebetween; and
a conductive plate that includes a second lead terminal and a semiconductor element bonding portion which is bonded to the second main surfaces of the two or more semiconductor elements, with a second bonding material layer interposed therebetween,
wherein
the semiconductor elements are arranged such that a longitudinal direction thereof is parallel to the second lead terminal,
the semiconductor element bonding portion of the conductive plate, the second bonding material layer, the semiconductor elements, the first bonding material layer, and the bonding portion of the electrode plate are sealed by a molding resin,
the first lead terminal of the electrode plate and the second lead terminal of the conductive plate are external terminals, and
the conductive plate includes a portion that extends outside the molding resin in a different direction from a direction in which the first lead terminal and the second lead terminal extend outside the molding resin.

10. The semiconductor device according to claim 9, wherein a space which is surrounded by the semiconductor elements, the one surface of the electrode plate, and the conductive plate is filled with a resin.

11. A semiconductor device comprising:
two or more semiconductor elements each of which has electrodes on a first main surface and a second main surface;
an electrode plate that includes a bonding portion which is formed on one surface and is bonded to the first main surfaces of the two or more semiconductor elements, with a first bonding material layer interposed therebetween, and extends from the bonding portion through a bent portion;
a conductive plate that includes a first lead terminal and a semiconductor element bonding portion which is bonded to the second main surfaces of the semiconductor elements, with a second bonding material layer interposed therebetween, and is connected to the second main surfaces of the two or more semiconductor elements; and a second lead terminal that is bonded to a connection portion extending from the bent portion of the electrode plate, with a third bonding material layer interposed therebetween, wherein the semiconductor elements are arranged such that a longitudinal direction thereof is parallel to the first lead terminal.

12. The semiconductor device according to claim 11, wherein the semiconductor element bonding portion of the conductive plate, the second bonding material layer, the semiconductor elements, the first bonding material layer, and the bonding portion of the electrode plate are sealed by a molding resin, and the first lead terminal of the conductive plate and the second lead terminal are external terminals.

13. The semiconductor device according to claim 11, wherein a space which is surrounded by the semiconductor elements, the one surface of the electrode plate, and the conductive plate is filled with a resin.

14. A semiconductor device comprising:

two or more semiconductor elements, each of which has electrodes on a first main surface and a second main surface and is arranged such that a longitudinal direction thereof is parallel to an injection direction of a molding resin sealing;

an electrode plate that includes a first lead terminal and a bonding portion which is formed on one surface, is bonded to the first main surfaces of the two or more semiconductor elements, with a first bonding material layer interposed therebetween, extends over the first main surfaces of the semiconductor elements, and has convex portions formed in bonding portions to the first main surfaces of the semiconductor elements; and a conductive plate that includes a second lead terminal and a semiconductor element bonding portion which is bonded to the two or more semiconductor elements, with a second bonding material layer interposed therebetween.

15. The semiconductor device according to claim 14, wherein the semiconductor element bonding portion of the conductive plate, the second bonding material layer, the semiconductor elements, the first bonding material layer, and the bonding portion of the electrode plate are sealed by the molding resin, and the first lead terminal of the electrode plate and the second lead terminal of the conductive plate are external terminals.

16. The semiconductor device according to claim 9, wherein the electrode plate is made of Cu, Al, or alloys including Cu and Al.

17. A method for manufacturing the semiconductor device according to claim 10, comprising:

a first bonding material layer forming step of forming the first bonding material layer on the bonding portion of the electrode plate;

a first bonding step of arranging and bonding the first main surfaces of the two or more semiconductor elements to the first bonding material layer;

a second bonding material layer forming step of forming the second bonding material layer on the semiconductor element bonding portion of the conductive plate;

a second bonding step of arranging and bonding the second main surfaces of the semiconductor elements bonded to the electrode plate to the second bonding material layer;

a resin filling step of injecting a resin into a space which is surrounded by the semiconductor elements, the electrode plate, and the conductive plate and hardening the resin; and a molding step of sealing the semiconductor element bonding portion of the conductive plate, the second bonding material layer, the semiconductor elements, the first bonding material layer, and the bonding portion of the electrode plate with a molding resin.

18. The semiconductor device according to claim 3, wherein the resin is a thermosetting resin.

19. The semiconductor device according to claim 1, wherein the first bonding material layer or the second bonding material layer is solder paste or silver-based conductive paste.

* * * * *